(12) United States Patent
Lee

(10) Patent No.: US 7,369,438 B2
(45) Date of Patent: May 6, 2008

(54) COMBO MEMORY DESIGN AND TECHNOLOGY FOR MULTIPLE-FUNCTION JAVA CARD, SIM-CARD, BIO-PASSPORT AND BIO-ID CARD APPLICATIONS

(75) Inventor: Peter W. Lee, Saratoga, CA (US)

(73) Assignee: Aplus Flash Technology, Inc., San Jose, CA (US)

( * ) Notice: Subject to any disclaimer, the term of this patent is extended or adjusted under 35 U.S.C. 154(b) by 106 days.

(21) Appl. No.: 11/305,700

(22) Filed: Dec. 16, 2005

(65) Prior Publication Data
US 2006/0138245 A1    Jun. 29, 2006

Related U.S. Application Data

(60) Provisional application No. 60/640,080, filed on Dec. 28, 2004.

(51) Int. Cl.
*G11C 11/34* (2006.01)
(52) U.S. Cl. ............................ 365/185.17; 365/185.29; 365/189.04; 365/189.09
(58) Field of Classification Search ........... 365/189.05, 365/185.29, 185.17, 189.09
See application file for complete search history.

(56) References Cited

U.S. PATENT DOCUMENTS

| | | | | |
|---|---|---|---|---|
| 5,629,901 | A * | 5/1997 | Ho ......................... | 365/230.05 |
| 6,122,191 | A * | 9/2000 | Hirose et al. .......... | 365/185.01 |
| 6,370,081 | B1 | 4/2002 | Sakui et al. ............ | 365/238.5 |
| 6,801,458 | B2 | 10/2004 | Sakui et al. ........... | 365/185.24 |
| 6,807,095 | B2 | 10/2004 | Chen et al. ............ | 365/185.02 |
| 6,850,438 | B2 | 2/2005 | Lee et al. .............. | 365/185.11 |
| 6,850,439 | B1 | 2/2005 | Tanaka ................... | 365/185.17 |
| 6,859,394 | B2 | 2/2005 | Matsunaga et al. .... | 365/185.17 |
| 6,862,223 | B1 | 3/2005 | Lee et al. .............. | 365/185.33 |
| 6,930,921 | B2 | 8/2005 | Matsunaga et al. .... | 365/185.18 |
| 2004/0228200 | A1* | 11/2004 | Shibata et al. .............. | 365/232 |
| 2005/0007857 | A1* | 1/2005 | Hiraki et al. ............... | 365/226 |

OTHER PUBLICATIONS

Co-pending U.S. App. No. 11/025,822, filed Dec. 24, 2004, "A Novel Combination Nonvolatile Integrated Memory System Using a Universal Technology Most Suitable for High Density, High-Flexibility and High-Security Sim-Card, Smart-Card and E-Passport Applications", assigned to the same assignee as the present invention.

(Continued)

*Primary Examiner*—Thong Q. Le
(74) *Attorney, Agent, or Firm*—Saile Ackerman LLC; Stephen B. Ackerman; Billy Knowles

(57) ABSTRACT

A combination volatile and nonvolatile memory integrated circuit has at least one volatile memory array placed on the substrate and multiple nonvolatile memory arrays. The volatile and nonvolatile memory arrays have address space associated with each other such that each array may be addressed with common addressing signals. The combination volatile and nonvolatile memory integrated circuit further has a memory control circuit in communication with external circuitry to receive address, command, and data signals. The memory control circuit interprets the address, command, and data signals, and for transfer to the volatile memory array and the nonvolatile memory arrays for reading, writing, programming, and erasing the volatile and nonvolatile memory arrays. The volatile memory array is may be a SRAM, a pseudo SRAM, or a DRAM. Any of the nonvolatile memory arrays maybe masked programmed ROM arrays, NAND configured flash memory NAND configured EEPROM.

71 Claims, 18 Drawing Sheets

OTHER PUBLICATIONS

Co-pending U.S. App. No. 10/351,180, filed Jan. 24, 2003, A Novel Monolithic, Combo Nonvolatile Memory Allowing Byte, Page and Block Write with No Disturb and Divided-Well in the Cell Array Using a Unified Cell Structure and Technology with a New Scheme of Decoder and Layout, assigned to the same assignee as the present invention.

* cited by examiner

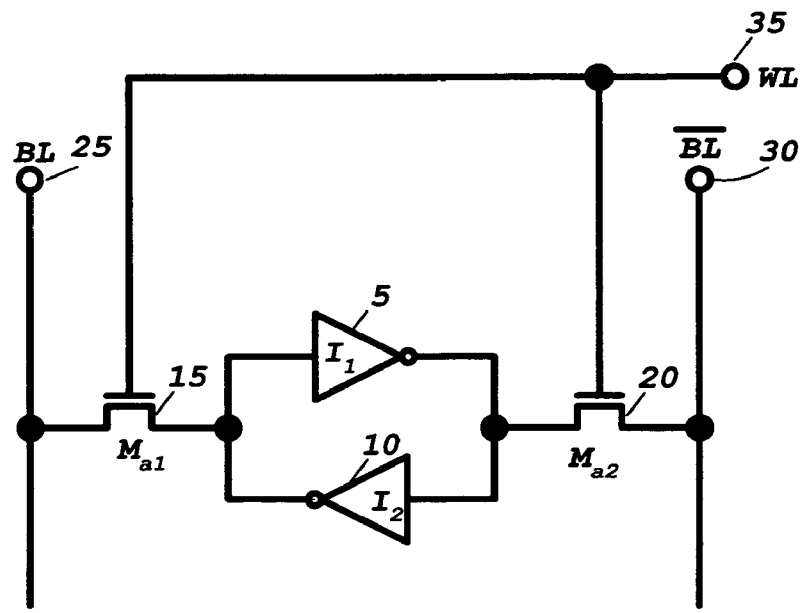
*Prior Art*      *Fig. 1a*
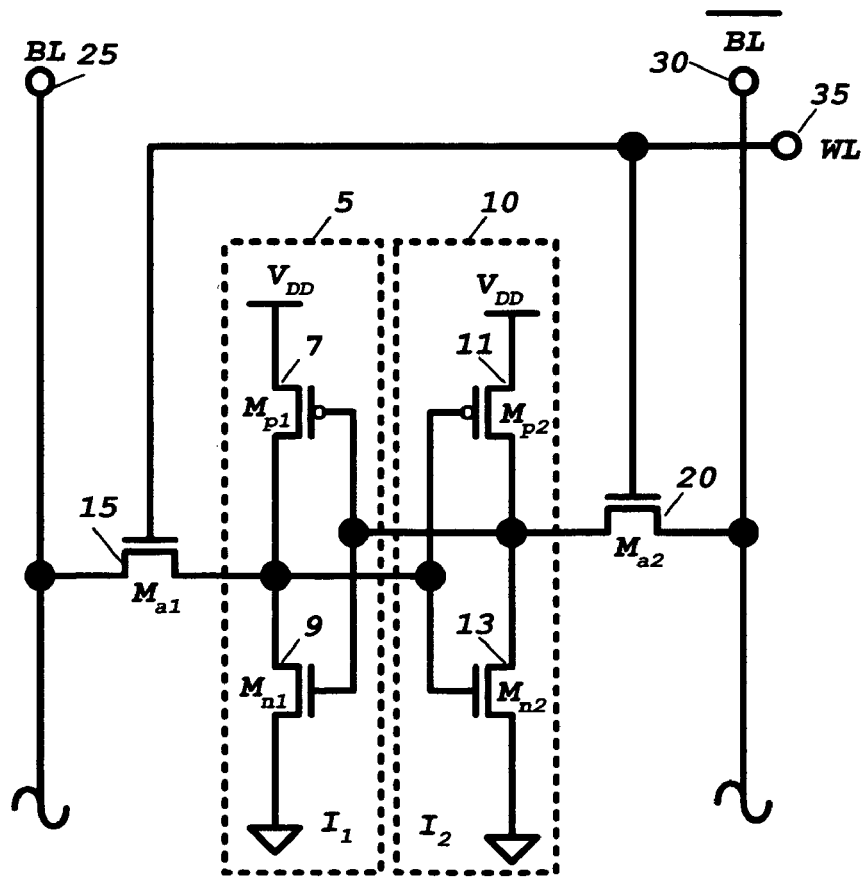
*Prior Art*      *Fig. 1b*

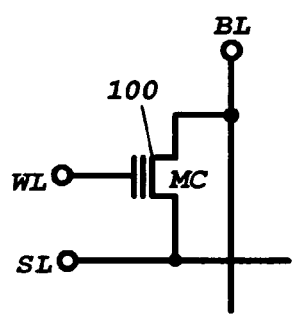
*Fig. 3a*
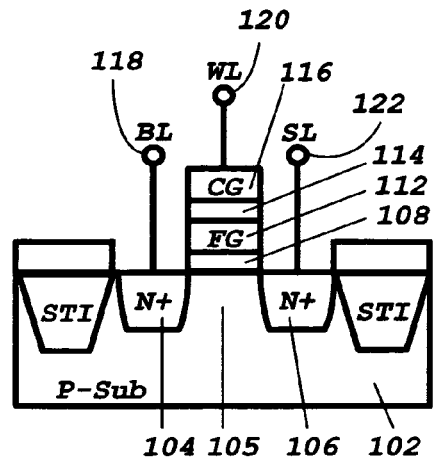
*Fig. 3b*
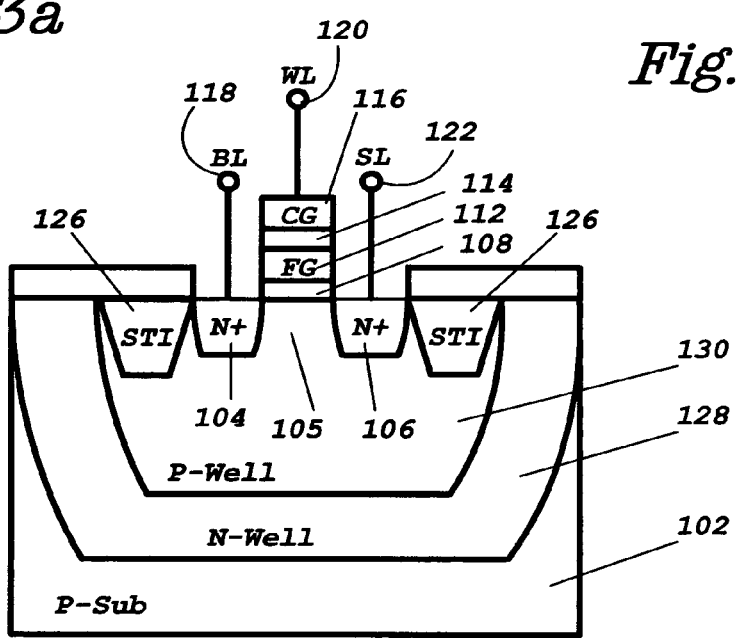
*Fig. 3c*
|  | Drain | Source | Gate | P-well. |
|---|---|---|---|---|
| Erase | 0V | 0V | < -18V | 0V |
| Program1 | 0V | 0V | >+18V | 0V |
| Program2 | $V_{INH}$ | $V_{INH}$ | >+18V | 0V |
*Fig. 3d*

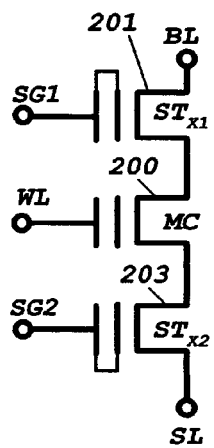
*Fig. 4a*
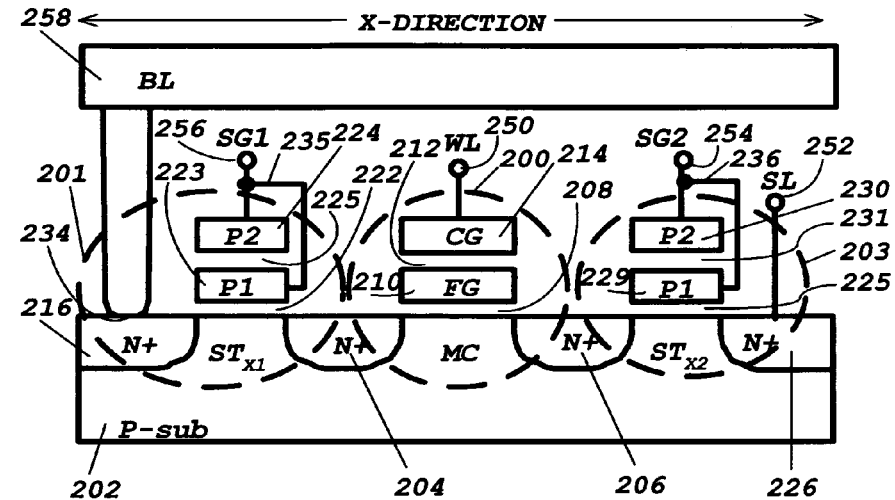
*Fig. 4b*
| Voltage | BL | SG1 | WL | SG2 | SL | Bulk | Scheme |
|---|---|---|---|---|---|---|---|
| Erase | 0 | VDD | -18V | VDD | 0 | 0 | FN (Channel) |
| Program Inhibit (selected WL) | VDD | VDD | +18V | 0 | VDD/0 | 0 | No FN |
| Program | 0 | VDD | +18V | 0 | VDD/0 | 0 | FN (Channel) |
*Fig. 4c*

| Voltage | GBL | SG1 | WL1 | WLj | WLN | SG2 | SL | Bulk | Scheme |
|---|---|---|---|---|---|---|---|---|---|
| Program | 0V | VDD | Vpro | +18V | 0V | 0V | VDD/0 | 0V | FN (Channel) |
| Program Inhibit (selected WL) | VDD | VDD | Vpro | +18V | 0V | 0V | VDD/0 | 0V | No FN effect |
| Erase | 0V | VDD | 0V | -18V | 0V | VDD | 0V | 0V | FN (Channel) |
| Erase Inhibit | 0V | 0V | 0V | 0V | 0V | 0V | 0V | 0V | No FN effect |

Fig. 5c

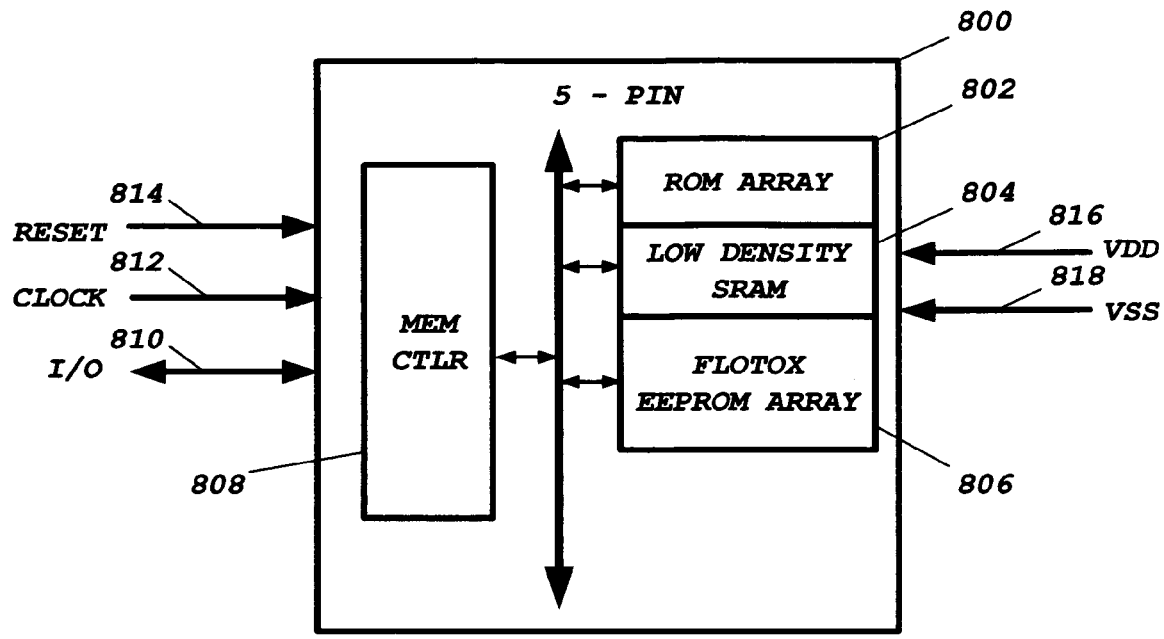
*Prior Art*  Fig. 10a
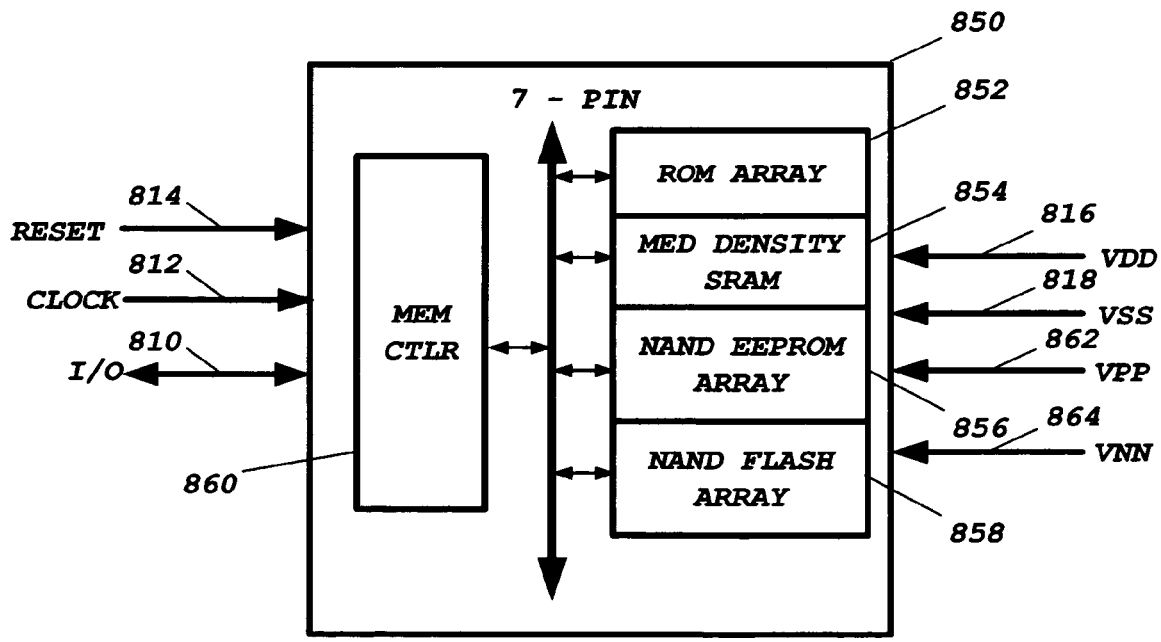
Fig. 10b

COMBO MEMORY DESIGN AND TECHNOLOGY FOR MULTIPLE-FUNCTION JAVA CARD, SIM-CARD, BIO-PASSPORT AND BIO-ID CARD APPLICATIONS

This application claims priority to U.S. Provisional Patent Application Ser. No. 60/640,080, filed on Dec. 28, 2004, which is herein incorporated by reference.

BACKGROUND OF THE INVENTION

1. Related Patent Applications

"A Novel Monolithic, Combination Nonvolatile Memory Allowing Byte, Page a Cell Array Using a Unified Cell Structure and Technology with a New Scheme of Decoder and Layout ", U.S. patent application Ser. No. 10/223,208, filed Aug. 19, 2002, assigned to the same assignee as the present invention, and herein incorporated by reference.

"A Novel Monolithic, Combination Nonvolatile Memory Allowing Byte, Page and Block Write with No Disturb and Divided-Well in the Cell Array Using a Unified Cell Structure and Technology with a New Scheme of Decoder and Layout", U.S. patent application Ser. No. 10/351,180, filed Jan. 24, 2003, assigned to the same assignee as the present invention, and herein incorporated by reference.

"A Combination Nonvolatile Memory Using Unified technology with Byte, Page and Block Write and Simultaneous Read and Write Operations", U.S. patent application Ser. No. 10/351,179, filed Jan. 24, 2003, assigned to the same assignee as the present invention, and herein incorporated by reference.

"A Novel Combination Nonvolatile Integrated Memory System Using a Universal Technology Most Suitable for High-Density, High-Flexibility And High-Security Sim-Card, Smart-Card And E-Passport Applications", U.S. patent application Ser. No. 11/025,822, filed Dec. 24, 2004, assigned to the same assignee as the present invention, and herein incorporated by reference.

2. Field of the Invention

This invention relates generally to integrated circuit memory. More particularly this invention relates to combinations of volatile and nonvolatile memory incorporated with an integrated circuit structure. Even more particularly this invention relates to combinations of static random access memory (SRAM), NAND flash electrically erasable programmable read only memory (flash memory), and NAND configured electrically erasable programmable read only memory (EEPROM) on one substrate for incorporation with a system-on-a-chip structure (SOC).

3. Description of Related Art

Volatile memory, as is well known in the art, retains data temporarily such that that any interruption of the power supply voltage source causes a loss of the data. The static random access memory (SRAM) is well known example of a volatile memory and consists of a bistable transistor flip-flop or latching circuit. Referring to FIGS. 1a and 1b, the inverters $I_1$ 5 and $I_2$ 10 are coupled such that the output of the inverter $I_1$ 5 is connected to the input of the inverter $I_2$ 10 and the output of the inverters $I_2$ 10 is connected to the input of the inverter $I_1$ 5 to form the bistable latch. The access transistor $M_{a1}$ 15 has a first source/drain terminal connected to the input of the inverter $I_1$ 5 and the output of the inverter $I_2$ 10 and a second source/drain terminal connected to the bit line BL 25. The access transistor $M_{a2}$ 20 has a first source/drain terminal connected to the input of the inverter $I_2$ 10 and the output of the inverter $I_1$ 5 and a second source/drain terminal connected to the bit line $\overline{BL}$ 30. The gates of the access transistors $M_{a1}$ 15 and $M_{a2}$ 20 are connected to the word line WL 35 to receive the activation signals for accessing the memory cell.

In operation, the bit lines BL 25 and $\overline{BL}$ 30 are precharged respectively to the data to be written or read from the memory cell. The word Line WL 35 is set to a voltage level sufficient to activate the access transistors $M_{a1}$ 15 and $M_{a2}$ 20 and the digital signal representative of the binary data to be written to or read from the memory cell is transferred to or from the memory cell.

The inverter $I_1$ 5 consists of the n-type MOS transistor $M_{n1}$ 9 and the p-type MOS transistor $M_{p1}$ 7 configured as the well known CMOS inverter. Similarly the inverter $I_2$ 10 consists of the n-type MOS transistor $M_{n2}$ 13 and the p-type MOS transistor $M_{p2}$ 11 also configured a CMOS inverter. The gates of the n-type MOS transistor $M_{n1}$ 9 and the p-type MOS transistor $M_{p1}$ 7 are connected to the common drain connection of the n-type MOS transistor $M_{n2}$ 13 and the p-type MOS transistor $M_{p2}$ 11 and the gates of the n-type MOS transistor $M_{n2}$ 13 and the p-type MOS transistor $M_{p2}$ 11 are connected to the common drain connection of the n-type MOS transistor $M_{n1}$ 9 and the p-type MOS transistor $M_{p1}$ 7. This forms the cross-connection to create the bistable flip-flop. The sources of the n-type MOS transistor $M_{n1}$ 9 and the p-type MOS transistor $M_{p1}$ 7 are connected to the ground reference voltage source and the sources of the p-type MOS transistors $M_{p1}$ 7 and $M_{p2}$ 11 are connected to the power supply voltage source $V_{DD}$.

An alternative to the SRAM is a pseudo-static random access memory (PSRAM). The PSRAM is as is known in the art is formed of a single transistor gating charge representing the digital data to and from a capacitor. The structure is essentially that of a dynamic random access memory with the controls for refresh and timing being internally generated.

The alternative to the volatile memory is the nonvolatile read only memory (ROM). The cell structure and application of the nonvolatile ROM is well known in the art. The nonvolatile ROM has four classifications the masked Programmable Read Only Memory (ROM), Electrically Programmable Read Only Memory (EPROM), Erasable and Programmable Read Only Memory (EEPROM), and the flash Electrically Erasable and Programmable Read Only Memory (Flash).

A masked ROM cell consists of a single transistor. The masked ROM cells are arranged in rows and columns. The gate of each ROM cell is connected to a word line, the drain is connected to a bit line and the source is connected to a source line. The programming or reprogramming of a ROM has to be performed during the integrated circuit fabrication through costly mask changes and a slow throughput of generally approximately one month. In a ROM array configuration, the ROM cells in each column are connected to a common bit line in parallel. Therefore, ROM read access speed is fast. A ROM cell uses a single polycrystalline silicon process on a P-type substrate. The mask programming of the ROM is performed using a post-polycrystalline silicon Boron implant that penetrates through the cell's polycrystalline silicon gate to channel to adjust the threshold voltage $V_T$ of the ROM cell.

The cell structure and application of the floating gate nonvolatile memories is well known in the art. The floating gate nonvolatile memory has three classifications the Electrically Programmable Read Only Memory (EPROM), Erasable and Programmable Read Only Memory (EEPROM), and the flash Electrically Erasable and Programmable Read Only Memory (Flash). The EPROM is programmed by electrically forcing charge to the floating gate. Ultra-violet light is employed to eliminate (erase) the electrical charges of the programming from the floating gate of the EPROM. During EPROM program operation, in addition to a low-voltage power supply (VDD), an external high-voltage programming power supply (VPP) of about 12V is used. With a sealed package, UV-light cannot reach floating-gate, thus the erase operation is blocked and the EPROM is considered a One Time Programmable (OTP) EPROM. If the sealed OTP is changed to sealed Flash, then both erase and program operations can be performed electrically and repeatedly in system without the overheads of UV-light exposure and the external VPP programmer due to Flash's on-chip charge pump that can generate high voltage internally.

The sealed Flash is now able to be programmed and erased number times by using the external high-voltage power supplies to eliminate the on-chip charge pumps and state-machine without UV-light exposure to achieve numerous program and erase cycles. In this method, the die size can be drastically reduced for cost reduction. The prior art of the EEPROM and the Flash memories are structurally different at the individual cell as well as in technologies, array organizations and write schemes and conditions. In the prior art, 1-transistor NOR-type Flash, the drains of the cells within a block are connected in parallel to bit lines in cell array to achieve faster read speed. The erase block size is large ranging from 8 KB (64 Kb) to 64 KB (512 Kb) due to the limitation of erase operating voltage condition. The erase voltages have the memory cell's gate set to a voltage of approximately −10V and memory cell's P-Well set to approximately +10V. Having to set the P-Well to approximately +10V forces a requirement that the size of the sub-array or block of memory to be erased to be large to minimize the impact of the size constraints of a P-Well. Due to this operating voltage limitation, currently there is no page erase in unit of single word line size offered with acceptable endurance cycles of more than 100K in market. In the prior art, 1-transistor, NAND-type Flash memory, the drains and sources of cells are connected in series with a disadvantage of slower read speed but an advantage of most compact cell array. Like 1-transistor, NOR Flash, the cells are formed on P-well within deep N-well on top of P-substrate. The erase operation is performed by coupling the gate of the memory cell to the ground reference voltage (0V) and coupling the P-Well to a voltage source of approximately +20V. Having to apply the power supply to P-Well for each memory cell to be erased forces the erase size to be relatively large. The Erase size of the NOR flash memory cannot be performed in a unit of single word line. In prior art, typical 2-transistor EEPROM cell has cell scalability issue and stays at 0.25 µm.

The three nonvolatile memory technologies (EEPROM, NOR-type and NAND-type flash memory) of prior art are process incompatible and were never intended to be manufactured on a single integrated circuit chip. The EEPROM, NOR-type and NAND-type flash memory have the charge transferred to the floating gate for programming by either a channel hot injection (CHE) of the charge or by Fowler-Nordheim Tunneling (FN) through a tunneling oxide. The erasure of the EEPROM and Flash memory is generally by a Fowler-Nordheim Tunneling through the tunneling oxide.

Presently, the key primary applications nonvolatile memory systems and technologies are smart-cards. A smart card is a tiny secure computer processor embedded within a credit card-sized card. Smart cards presently are designed to comply with ISO/IEC 7816, 14443, and 15693 series of standards that define the physical shape of the smart card, the positions and shapes of its electrical connectors (if any), the communications protocols and power voltages to be applied to those connectors, the functionality, and the format of the commands sent to the card and the response returned by the card. Some smart cards may have physical connectors and other structures may have no external connections and communicate by way of radio frequency identification (RFID). Further, the compact nature of the smart card leads to the desirability for the processor, memory function, and support functions to be placed on a single chip.

The smart card is employed in such as applications Subscriber Identity Module (SIM-card) and Electronic Passport (e-passport to store personalized biometric data such as DNA, finger-print, iris and facial picture), to store data of multiple applications and Biometric Information Authentication System (BIAS) programs and to store small data such as telephone numbers and short email messages in same chip. Historically, the permanent program memory such as Basic Input/Output System (BIOS) and applications for the microprocessor was formed of classic mask programmable read only memory (ROM), and later as EPROM. Modifications to the program memory required physically changing the memory.

As the need to update the programs of the microprocessor and applications in system and allow for more than one time became more important, NOR-type flash memory was used. As the demand for serially downloading the audio and video slow-speed data, the high-density NAND-type flash was commonly used for cost reduction. But for those requiring byte-alterable small data memory, EEPROM was replacing flash memory. These three technologies were developed to provide in-system rewriteability. However, processes of EEPROM, NOR-type flash, NAND-type flash memories are not fully compatible in the present technology and are difficult to integrate on the same integrated circuit chip.

As the applications for microprocessors and microcontrollers are becoming more pervasive, the need for storage that is permanent and will not fail or disappear when power is removed is required. In most applications, the program is not modified often. However, the application data is changed relatively frequently. The program memory can be classified as configuration, traceablity, boot program, or main program and application programs. The application data includes information from any external input to the system, e.g., operational, instrument, recorder, or sensor data that is required for historical purposes or to maintain continuity of operation after power down or power loss. Data memory is typically frequently altered over the lifetime of the application, thus demand for much higher program/erase (P/E) cycles of more than 500K.

Recently, there are more and more applications that require addition of more security functions in smart card functions such as e-passport and SIM-card. Most of the security schemes are mandatory asking to store personalized biometric data such as DNA, iris, facial and finger prints. Traditionally, the small NAND-flash cell was not used in low-density card technology, thus the large NOR-type flash cell or the larger EEPROM cell were employed instead to store such biometric data. The effective cell size of 1-transistor NAND is around $4\lambda$ square, while 1-transistor NOR-type Flash is around $10\lambda$ square and 2-transistor EEPROM cell is about $80\lambda$ square. Please, note that $\lambda$ is a unit of the minimum feature size. That means $\lambda$ of a 0.13 µm process is 0.13 µm. Obviously, using the big 1-transistor NOR Flash and the bigger EEPROM cell to store personalized biometric data is wasteful of space. Particularly, in smart card technology, the final die size of a smart card system-on-a-chip that contains all Flash, EEPROM, SRAM, CPU, and Cryptographic processor has to be made within 25 mm square to avoid die cracking. A system-on-a-chip (SOC) integrates all components of a computer system into a single chip. The chip contains an embedded computer processor, program memory, application data memory, and appropriate input/output function. In applications such as cellular telephones and wireless personal digital assistants, a SOC contains digital, analog, mixed-signal, and radio-frequency functions within a single integrated circuit chip With higher and higher security required for smart card applications, the pressure of more and more personalized data is strongly required in a tiny die area of card. For example, storing ten finger prints is more preferable than to store just one thumbprint from security viewpoint. Having facial picture data from more angles is superior to the data from just one angle. Storing whole finger prints, iris and facial pictures or even DNA in one chip is better than to store part of it from security perspective.

The cells size of the EEPROM and NOR-type Flash memories no longer make these memories a cost effective solution to store personalized biometric data. The smallest cell size of 1-transistor NAND-type flash as noted above is $4\lambda$ square and is preferably used for personalized data storage memory.

High-level language software such as Java card system from Sun Microsystems, Inc., Santa Clara, Calif. 95054 provide easy and fast development software processes for creating and integrating software for multiple application down-loadable programs. Therefore, a flexible, easily partitioned small, non-uniform block size NOR-type flash system for multiple function programs is desirable in smart card applications.

The traditional large cell size of EEPROM technology is essentially non-scalable below 0.25 μm and thus it is not suitable for storing memory density higher than 1 Mb (128 KB). The trend is to use low-cost flash technology to replace traditional EEPROM but still retain the features of byte-alterable scheme and high P/E cycles of more than 500K.

The number of times that a nonvolatile memory must be altered determines the endurance requirement of the device. Nonvolatility requires the device to retain data without power applied for the lifetime of the application. The lifetime of the application determines the data retention requirement of the device. Both of the reliability requirements of endurance and data retention have associated failure rates, which must be minimized. Since NOR-type flash memories is employed as the program and application memory, it has the less amount of reprogramming and erasing, therefore, it must have the longest data retention and require the medium endurance (approximately 100,000 program/erase cycles). Conversely, the EEPROM, employed as data memory, must be able to be modified repeatedly and therefore must have higher endurance (more than 1 million program and erase cycles). The NAND-type flash nonvolatile memory preferably used to store personalized data. It does not require too many updates and endurance (approximately 10K program/erase less cycles depending on the applications).

U.S. Pat. Nos. 6,801,458 and 6,370,081 (Sakui, et al.) provide a memory cell array that has a unit memory circuit formed from one memory cell and two select transistors sandwiching the memory cell. One block has one control gate line. Memory cells connected to one control gate line form one page. A sense amplifier having a latch function is connected to a bit line. In a data change operation, data of memory cells of one page are read to the sense amplifiers. After data are superscribed on data in the sense amplifiers, and a page erase is performed, data in the sense amplifiers are programmed in the memory cells of one page. Superscription of data in the sense amplifiers allows a data change operation for byte data or page data. Sakui, et al. provides essentially 3-transistor EEPROM cell based on the structure of NAND cell. Each block of the EEPROM cells are grouped together in the individual wells such that the bulk of each memory cell of the block is commonly connected.

SUMMARY OF THE INVENTION

An object of this invention is to provide an integrated circuit that combines volatile and nonvolatile memory on a single substrate.

Another object of this invention is provide a memory control circuit that provide address, control and data signals for reading, writing, programming, and erasing a combination of volatile and nonvolatile memory.

To accomplish at least one of the objects, a combination volatile and nonvolatile memory integrated circuit is formed on a substrate. The combination volatile and nonvolatile memory integrated circuit has at least one volatile memory array placed on the substrate and a plurality of nonvolatile memory arrays placed on the substrate. The volatile and nonvolatile memory arrays have address space associated with each other such that each array may be addressed with common addressing signals. The combination volatile and nonvolatile memory integrated circuit further has a memory control circuit in communication with external circuitry to receive address, command, and data signals. The memory control circuit interprets the address, command, and data signals, and for transfer to the volatile memory array and the plurality of nonvolatile memory arrays for programming, reading, and erasing the volatile and nonvolatile memory arrays.

A voltage generator generates a very large positive programming voltage and a very large negative erasing voltage and is in communication with the nonvolatile memory arrays to transfer the very large positive programming voltage to selected first sub-arrays of the nonvolatile memory arrays for programming the selected first sub-arrays and to transfer the very large negative erasing voltage to selected second sub-arrays of the nonvolatile memory arrays for erasing the selected second sub-arrays. The voltage generator further generates a power supply voltage, a first moderately high positive program voltage, a second moderately high positive program voltage, an intermediate positive program voltage, and a ground reference voltage.

The volatile memory array is may be a static random access memory, a pseudo static random access memory, or a dynamic random access memory. Any of the plurality of the nonvolatile memory arrays maybe masked programmed read only memory arrays for retention of permanent unchangeable data. For retention of long term data that has a low number of program and erase cycles, any of the plurality of the nonvolatile memory arrays may be NAND configured flash memory. The long term data may be application program data, biometric identification information data, and other digital data not requiring a high rate of modification. For retention of shorter term data that has a high number of program and erase cycles, any of the plurality of the nonvolatile memory arrays may be three transistor NAND configured electrically erasable programmable read only memories. The shorter term data may be short electronic mail digital data, electronic phone book digital data, and other digital data requiring a high rate of modification.

If one of the nonvolatile memory arrays is the NAND configured flash memory, selected first sub-arrays are programmed by setting at least one bit line of the selected first sub-arrays to the second moderately high positive program voltage At least one word line of the selected first sub-arrays is set to the very large positive programming voltage. At least one source line of the selected first sub-arrays is to the second moderately high positive program voltage, and a bulk region of all cells of the selected first sub-array is set to the ground reference voltage.

If the one of the nonvolatile memory arrays is the three transistor NAND configured electrically erasable programmable read only memory, the selected first sub-arrays is programmed by setting at least one bit line of the selected first sub-arrays to the ground reference. At least one first select gate line of the selected sub-arrays is set to the power supply voltage. At least one second select gate line of the selected sub-arrays is set to the ground reference voltage. At least one word line of the selected first sub-arrays is set to the very large positive programming voltage and at least one source line of the selected first sub-arrays to the ground reference voltage. The bulk region of all cells of the selected first sub-array is set to the ground reference voltage. Those cells of the selected first sub-arrays that are not programmed but have the word line at the very large positive programming voltage are inhibited from programming by setting bit lines of non-selected cells of the selected sub-arrays to the power supply voltage.

Selected second sub-arrays of the three transistor NAND configured electrically erasable programmable read only memory is erased by setting at least one first select gate line and second select gate line of the selected sub-arrays to the power supply voltage, at least one word line of the selected second sub-arrays to the very large negative erasing voltage, at least one bit line of the selected second sub-arrays, at least one source line of the selected second sub-arrays, and a bulk region of all cells of the selected second sub-array to the ground reference voltage.

The memory control circuit of the combination volatile and nonvolatile memory integrated circuit controls the transfer data resident within any of the plurality of nonvolatile memories to the volatile memory such that the volatile memory. The volatile memory thus retains data that is operational data, temporary data, or scratch pad data that is temporary in nature.

BRIEF DESCRIPTION OF THE DRAWINGS

FIGS. 1a and 1b are schematic diagrams of an SRAM of the prior art.

FIG. 3a is a schematic diagram of a floating gate transistor of a nonvolatile memory cell as incorporated in the combination volatile and nonvolatile memory integrated circuit of this invention.

FIGS. 3b and 3c are cross sectional diagrams of a substrate into which a floating gate transistor of a nonvolatile memory cell as incorporated in the combination volatile and nonvolatile memory integrated circuit of this invention.

FIG. 3d is a table illustrating the erase and program voltages of the floating gate transistor of the nonvolatile memory cell as incorporated in the combination volatile and nonvolatile memory integrated circuit of this invention.

FIG. 4a is a schematic diagram of a 3-transistor NAND configured nonvolatile memory cell as incorporated in the combination volatile and nonvolatile memory integrated circuit of this invention.

FIG. 4b is a planar view of a 3-transistor NAND configured nonvolatile memory cell as incorporated in the combination volatile and nonvolatile memory integrated circuit of this invention.

FIG. 4c is a table illustrating the erase and program voltages of the 3-transistor NAND configured nonvolatile memory cell as incorporated in the combination volatile and nonvolatile memory integrated circuit of this invention.

FIG. 5c is a table illustrating the erase and program voltages of the transistor NAND configured flash EEPROM as incorporated in the combination volatile and nonvolatile memory integrated circuit of this invention.

FIG. 10a is a block diagram of a combination volatile and nonvolatile memory integrated circuit of the prior art including ROM, SRAM, and FLOTOX flash memory.

FIGS. 10b-10d are block diagrams of embodiments of a combination volatile and nonvolatile memory integrated circuit of the present invention including ROM, SRAM, NAND configured flash memory, and NAND configured EEPROM.

DETAILED DESCRIPTION OF THE INVENTION

Figure 2A:
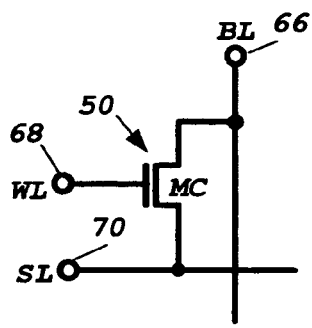
FIG. 2a is a schematic diagram of a mask ROM memory cell as incorporated in the combination volatile and nonvolatile memory integrated circuit of this invention.
Figure 2B:
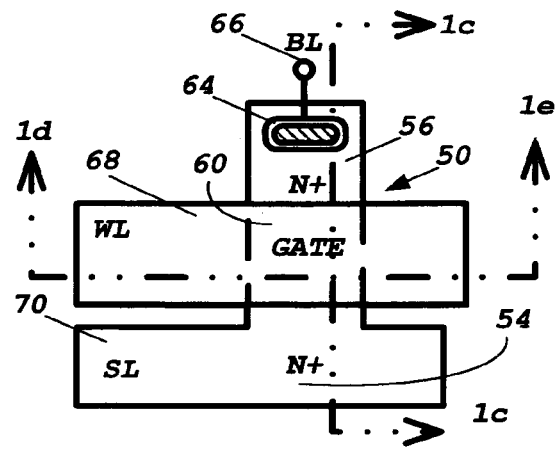
FIG. 2b is plan view of the mask ROM memory cell as incorporated in the combination volatile and nonvolatile memory integrated circuit of this invention.
Figure 2C:
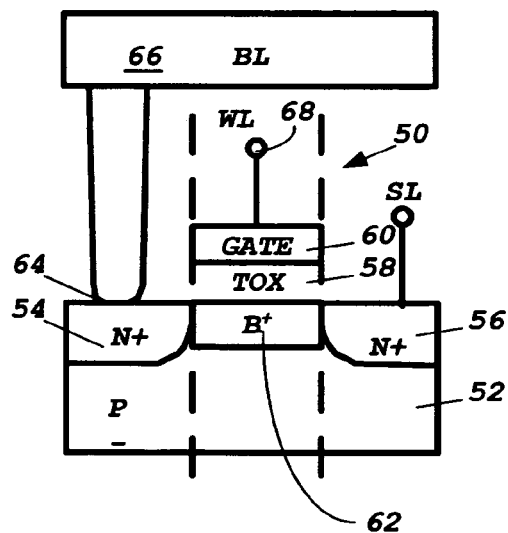
FIGS. 2c and 2d are cross sectional views of the mask ROM memory cell as incorporated in the combination volatile and nonvolatile memory integrated circuit of this invention.
Figure 2D:
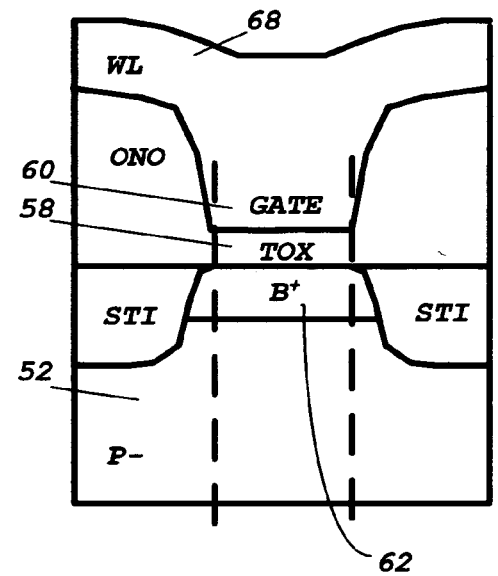

A combination volatile and nonvolatile memory integrated circuit of this invention incorporates at least one volatile memory array (SRAM, PSRAM, or DRAM), at least one mask programmable ROM, and multiple NAND configured nonvolatile memory arrays within the same integrated circuit. A memory control circuit is connected to communicate with external circuitry to receive address, command, and data signals, to interpret said address, command, and data signals. The memory control circuit develops the necessary timing and control signals to transfer the address, command and data signals for reading, writing, programming, and erasing the volatile and nonvolatile memory arrays.

The SRAM as incorporated in the combination volatile and nonvolatile memory integrated circuit of this invention is as described above for FIGS. 1a and 1b.

A mask programmable ROM memory cell as incorporated in the combination volatile and nonvolatile memory integrated circuit of this invention is a single transistor cell that is mask programmed using a post-polycrystalline silicon Boron implant that penetrates through the cell's polycrystalline silicon gate to the channel to adjust the threshold voltage $V_T$ of the ROM cell.

A NAND configured nonvolatile memory cell as incorporated in the combination volatile and nonvolatile memory integrated circuit of this invention has a string of serially connected floating gate transistors sequentially connected source to drain. The first floating gate transistor of the string of serially connected floating gate transistors has its drain connected to the source of a select gating transistor. The last transistor of the string of serially connected floating gate transistors has its source connected to the drain of a second select gating transistor. The control gate of each floating gate transistor of the serially connected floating gate transistors is connected to a word line terminal for selectively activating the floating gate transistor. The drain of the first select gating transistor is connected to a bit line terminal and the source of the second select gating transistor is connected to a source line terminal.

The difference between a NAND configured flash memory cell and a NAND configured EEPROM is in the number of floating gate transistors serially connected. In a NAND configured flash memory cell, the application is for more permanent data requiring fewer program and erase cycles. The fewer program and erase cycles permit a more dense configuration. In a practical configuration the NAND configured Flash array has 16 or 32 serially connected floating gate transistors between the first and second gating transistors. The NAND configured flash further is organized in larger blocks of more than 64 or 128 bytes. In the NAND configured EEPROM, the application is for short term data requiring greater program and erase cycles. To reduce the effects of programming and erasing disturbances, the NAND configured EEPROM has fewer floating gate transistors between the first and second select gating transistors. The NAND configured EEPROM further is configured for reading, programming and erasing in smaller blocks such as single or small multiple (two or four) byte increments.

FIGS. 2a-d illustrate a one-transistor mask programmable memory cell used to form a ROM array as incorporated in the combination volatile and nonvolatile memory integrated circuit of this invention. The mask programmable nonvolatile memory cell 50 shown in FIG. 2a is essentially a Metal Oxide Semiconductor (MOS) transistor with a drain, source, and a control gate. The mask programmable nonvolatile memory cell 50 is formed within a p-type substrate 52. An $n^+$ drain region 54 and an $n^+$ source region 56 are formed within the p-type substrate 52.

A relatively thin gate dielectric or oxide 58 is deposited on the surface of the p-type substrate 52. A poly-crystalline silicon gate 60 is formed on the surface of the oxide 58 above the channel region 62 between the drain region 54 and source region 56.

A post poly-crystalline silicon Boron implant penetrates through the poly-crystalline silicon gate 60 to the channel region 62 between the drain region 54 and source region 56 to adjust the threshold voltage $V_T$ of the ROM cell 50. Without having the Boron $B^+$ implant in the channel region 62, the threshold voltage $V_T$ of the ROM cell 50 is around 0.7V. While the threshold voltage $V_T$ Of the ROM cell 50 with the Boron $B^+$ implant in the channel region 62 is typically increased to more than 4V. Other methods known in the art and not described herein may be used to adjust the ROM's threshold voltage.

In an application, of a single transistor nonvolatile memory cell of this invention within a flash memory, the p-type substrate 52 is connected to a substrate biasing voltage, which in most instances is the ground reference potential (0V). The source region 56 is connected to a source line voltage generator through the source line terminal SL 70. The gate 60 is connected through the word line terminal WL 68 to a word line voltage generator. And the drain region 54 is connected through the contact 64 to the bit line 66 to a bit line voltage generator.

As described there is no erasure of the ROM memory cell 50 and the programming occurs during the fabrication of the integrated circuit containing the ROM memory cell 50. In a read operation, the source line voltage generator and thus the source line terminal SL 70 is set to the ground reference voltage level. In actuality, the source line may be permanently attached to the ground voltage level. The word line voltage generator sets the word line 68 and thus the gate 60 to approximately to to approximately the power supply voltage source ($V_{DD}$) to activate the ROM memory cell 50. The bit line voltage generator set the bit line 66 and thus the drain 54 to a a relatively low voltage level that is approximately 1.0V in order to avoid breakdown of the oxide 58 between the the drain 54 and the poly-crystalline silicon gate 60 and commonly referred to as bit line breakdown. If the ROM memory cell 50 does not have the Boron $B^+$ implant in the channel region 62, the ROM memory cell 50 is turned on and the bit line 66 is pulled to approximately the voltage level of the ground reference voltage level. Alternately, if the ROM memory cell 50 has the Boron $B^+$ implant in the channel region 62, the threshold voltage $V_T$ of the ROM memory cell is greater than the voltage level of the word line 68 voltage and the ROM memory cell 50 does not turn on and the bit line 66 remains at the level as applied by the bit line voltage generator.

Multiple ROM memory cells 50 are arranged in rows and columns to form an array on the p-type substrate 52. The word lines 68 connect the gates 60 of each row of ROM memory cells 50. The bit lines 66 connect the drains 54 of each column of ROM memory cells 50. The source lines 70 are generally just contacts directly to the P-type substrate 52, which is connected directly to the ground reference voltage level thus connecting the source regions 56 of each of the rows of memory cells 50 to the ground reference voltage level.

FIGS. 3a-c illustrate a one-transistor floating gate memory cell as incorporated in the combination volatile and nonvolatile memory integrated circuit of this invention. The floating gate memory cell 100 is formed within a p-type substrate 102. An n+ drain region 104 and an n+ source region 106 is formed within the p-type substrate 102, as shown in FIG. 3b. Alternately, the memory cell 100 may be formed in a triple well structure, as shown in FIG. 3c. In a triple well structure an N-type material is diffused into the substrate to form a deep N-well 128. An P-type material is then diffused into the deep N-type well 128 to form a P-type well 130. The n+ drain region 104 and the n+ source region 106 are formed within the P-type well 130. The triple well structure allows more isolation between different nonvolatile array types integrated on the single integrated circuit chip.

A relatively thin gate dielectric or tunneling oxide 108 is deposited on the surface of the p-type substrate 102 in the region of the P-type well 130. A poly-crystalline silicon floating gate 112 is formed on the surface of the tunneling oxide 108 above the channel region 105 between the drain region 104 and source region 106. An interpoly dielectric layer 114 is placed on the floating gate 112 to separate the floating gate 112 from a second layer of poly-crystalline silicon that forms a control gate 116.

The floating gate 112 is constrained to be aligned with the edges 110 of the drain 104 and the source 106 over the channel region 105. Further, there are no "wings" for smaller cell size or wings with larger cell size and the floating gate is constrained to the width of the drain 104 and the source 106. The coupling coefficient is thus around (~50%) for the cell structure without wings and more than 50% for cell structure with wings.

In an application, of a single transistor nonvolatile memory cell of this invention within a flash memory, the p-type substrate 102 is connected to a substrate biasing voltage, which in most instances is the ground reference voltage level (0V). The source region 106 is connected to a source voltage generator through the source line terminal SL 122. The control gate 116 is connected through the word line terminal WL 120 to a control gate voltage generator. And the drain region 104 is connected through a contact (not shown) to the bit line 118 to a bit line voltage generator.

The memory cell 100 is separated from adjacent memory cells or circuits of an integrated circuit on a substrate by the shallow trench isolation 126. The shallow trench isolation 126 provides a level isolation from disturbing signals from any operations of the adjacent cells.

To compensate for the case of lower the coupling ratio of the control gate 116 and floating gate 112, the magnitude of voltage applied to control gate has to be increased to maintain the same tunneling electrical field across the same thickness of tunneling oxide 108 to cause the flow of charge to or from the floating gate 112.

The single transistor flash memory cell of this invention is erased, as shown in the table of FIG. 3d, by setting word line generator and thus control gate 116 through the word line WL 120 to a relatively large negative erase voltage of from approximately −15.0 to approximately −22.0V, preferably −18.0V. The bit line voltage generator and thus the bit line BL 118 and the source line generator and thus the source SL 122 is connected such that the drain 104 and the source 106 are connected to the ground reference voltage. Under these conditions there is a large electric field developed across the tunneling oxide 108 in the channel region 105. This field causes the electrons trapped in the floating gate 112 to flow to channel region 105 by the Fowler-Nordheim tunneling.

The memory cell 100 is programmed (Program 1) as shown in the table of FIG. 3d by applying a relatively high positive programming voltage to the control gate 116 through the word line WL 120. The bit line voltage generator and the source line voltage generator are set to the ground reference voltage level (0V) to respectively set the bit line BL 118 and thus the drain 104 and the source line SL 122 and the thus the source 106 to the ground reference voltage level. With these voltages setup, an electric field will be produced at tunnel oxide layer of 108 between the channel 105 and floating gate 112. The electrons in channel region of 105 of the p-type substrate 102 will have sufficient energy to be accelerated across the tunneling oxide 108 and trapped on the floating gate 112. The trapped electrons will cause the threshold voltage of the field effect transistor (FET) that is formed by the memory cell 100 to be increased by three to five volts. This increase in threshold voltage by the trapped hot electrons causes the cell to be programmed from the un-programmed state of a logical one (1) to a logical zero (0).

To prevent a non-selected memory cell 100 from being programmed (Program 2) by setting the relatively high positive programming voltage (on the order of from approximately +15.0 to approximately +22.0V, preferably +18V) to the control gate 116 through the word line WL 120. The bit line voltage generator and the source line voltage generator are set to the ground reference voltage level (0V) to respectively set the bit line BL 118 and thus the drain 104 and the source line SL 122 and the thus the source 106 to an inhibit voltage $V_{INH}$. The inhibit voltage $V_{INH}$ is from approximately 6.0V to approximately 11.0V, preferably +9.0V.

FIGS. 4a and 4b illustrate the NAND configured nonvolatile memory cell of as incorporated in the combination volatile and nonvolatile memory integrated circuit of this invention. The NAND configured nonvolatile memory cell consists of a stacked gate or floating gate transistor 200, a first select gating transistor 201, and a second select gating transistor 203 formed on a p-type substrate 202. An n+ drain region 204 and an n+ source region 206 are formed within the p-type substrate 202.

A relatively thin tunneling oxide 208 is deposited on the surface of the p-type substrate 202. A poly-crystalline silicon floating gate 210 is formed on the surface of the tunneling oxide 208 above the channel region between the drain region 204 and source region 206. An interpoly dielectric layer 212 is placed on the floating gate 210 to separate the floating gate 210 from a second layer of poly-crystalline silicon that forms a control gate 214.

The drain 204 fundamentally is the source of the first select gating transistor 201. The drain 216 of the first select gating transistor 201 is connected through the contact 234 to the bit line 258. The first gate 223 of the first select gating transistor 201 is placed over the gate oxide 222 between the drain 204 of the floating gate transistor 200 and the drain 216 of the select transistor 201. The interpoly dielectric layer 225 is formed over the first gate 223, with a second gate 224 having equivalent structure to the control gate 214 formed over the interpoly dielectric layer 225.

The first and second gates 223 and 224 are connected separately through wiring traces 235 to a location near the end of the word line 250. The wiring traces 235 are connected to the select control line 256, which conducts a select signal to the first and second gates 223 and 224 of the first select gating transistor 201 to control the impact of the over-erasure of the memory cell.

The source 206 fundamentally is the drain of the second select gating transistor 203. The source 226 of the second select gating transistor 203 is connected to the source line 252. The first gate 229 of the second select gating transistor 203 is placed over the gate oxide 228 between the drain 204 of the floating gate transistor 200 and the drain 216 of the second select gating transistor 203. The interpoly dielectric layer 231 is formed over the first gate 229, with a second gate 230 having equivalent structure to the control gate 214 formed over the interpoly dielectric layer 231. The first and second gates 229 and 230 are connected separately through wiring traces 236 to a location near the end of the word line 250. The wiring traces 236 are connected to the select control line, which conducts a second select signal SG2 254 to the second select gating transistor 203 to similarly control the impact of the over-erasure of the floating gate transistor 200.

In most applications of an EEPROM or flash memory having the three transistor configuration, the p-type substrate 202 is connected to a substrate biasing voltage, which in most instances this is the ground reference potential (0V). The drain region 216 of the first select gating transistor 201 is connected to a bit line voltage generator through the contact 234 and the bit line terminal 258. The control gate 214 is connected through the word line terminal 250 to the word line voltage generator. The first select gating line 256 is connected to a select signal generator to provide a first select signal to the gate 224 of the first select gating transistor 201. The second select gating line 254 is connected to a select signal generator to provide a second select signal to the gate 230 of the second select gating transistor 203. And the source region 226 of the second select gating transistor 203 is connected to the source line 252 to a source line voltage generator.

In order to make a compact cell size and array, both the select gating transistors 201 and 203 are preferably made of same pitch in X-direction and structure as stacked gate or floating gate transistor of FIGS. 3a-c. The second level polycrystalline silicon (poly-2) gates 224 and 230 of the first and second select gating transistors 201 and 203 are tied to first level polycrystalline silicon (poly1) gate select lines 256 and 254 to turn the first and second select gating transistors 201 and 203 device into non-floating gate poly1 NMOS devices.

The erase and program conditions of 3-transistor NAND configured nonvolatile memory cell as incorporated in the combination volatile and nonvolatile memory integrated circuit of this invention are listed in table of FIG. 4c. To erase the NAND configured nonvolatile memory cell, the bit line generator sets the bit line 258 and thus the drain 216 of the first select gating transistor 201 to the ground reference level. The select gating generator sets the first select gating line 256 and thus the gate 224 of the first select gating transistor 201 to the power supply voltage $V_{DD}$. The word line voltage generator sets the word line 250 and thus the control gate 214 of the floating gate transistor 200 to the large negative erasing voltage of from approximately −15.0 to approximately −22.0V, preferably −18.0V. The select gating generator sets the second select gating line 254 and thus the gate 230 of the second select gating transistor 203 to the power supply voltage $V_{DD}$. The source line voltage generator sets the source line 252 and thus the source 226 of the second gating transistor 203 is set to the ground reference voltage. The bulk of the NAND configured nonvolatile memory cell is set to the ground reference voltage. The erase process is the low-current Fowler Nordheim tunneling process to the tunnel oxide 208 between the floating gate 210 and the P-type substrate 202.

The programming of the NAND configured nonvolatile memory cell has the bit line voltage generator setting the selected bit line 258 and thus the drain 216 of the first select gating transistor 201 to a ground reference voltage. The select gating generator sets the first select gating line 256 and thus gate 224 of the first select gating transistor 201 to the power supply voltage $V_{DD}$. The word line voltage generator sets the word line 250 and thus the control gate 214 of the floating gate transistor 200 to a large positive programming voltage of from approximately +15.0 to approximately +22.0V, preferably +18.0V. The source line voltage generator sets the source line 252 and thus the source 226 of the second select gating transistor 203 is set to the ground reference voltage to prevent bit line leakage. The bulk of the NAND configured nonvolatile memory cell is set to the ground reference voltage. The programming process is the low-current Fowler Nordheim tunneling process to the channel between the source 206 and the drain 204.

To prevent or inhibit programming of NAND configured nonvolatile memory cell of as incorporated in the combination volatile and nonvolatile memory integrated circuit of this invention on the selected word line 250, the bit line generator sets the bit line 258 and thus the drain 216 of the first select gating transistor 201 to the power supply voltage source $V_{DD}$. The select gating generator sets the select gating line 254 and thus gate 224 of the first select gating transistor 201 to the power supply voltage source $V_{DD}$. The word line voltage generator sets the word line 250 and thus the control gate 214 of the floating gate transistor 200 to the large positive programming voltage. The select gating generator sets the second select gating line 254 and thus the gate 230 of the second select gating transistor 203 to the ground reference voltage level to deactivate the second select gating transistor 203. The source line voltage generator sets the source line 252 may be set to either the power supply voltage level $V_{DD}$ or the ground reference voltage level to inhibit programming of the selected floating gate transistor 200

Figure 5A:
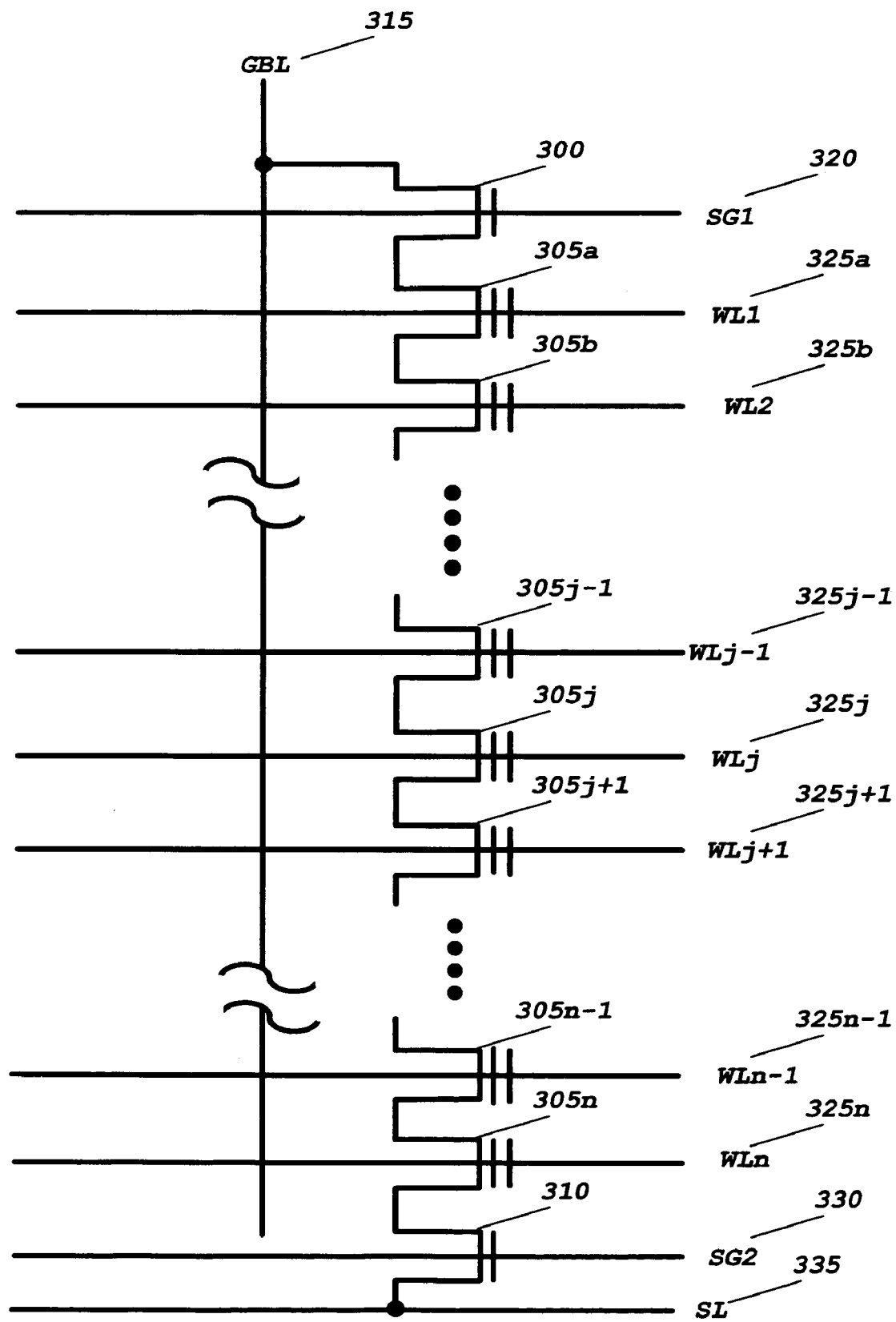
FIG. 5a is a schematic diagram of a multiple-transistor NAND configured nonvolatile memory cell as incorporated in the combination volatile and nonvolatile memory integrated circuit of this invention.

Referring to FIG. 5a, an n-transistor NAND configured nonvolatile memory cell of as incorporated in the combination volatile and nonvolatile memory integrated circuit of this invention includes N NAND configured floating gate transistors 305a, 305b, . . . , 305n−1, 305n connected serially drain to source. The gates of the N NAND configured floating gate transistors 305a, 305b, . . . , 305n−1, 305n are connected to the word lines WL1 325a, WL2 325b, . . . , WLn−1 325n−1, WLn 325n, The drain of the first floating gate transistor 305a of the N NAND configured floating gate transistors 305a, 305b, . . . , 305n−1, 305n is connected to source of the first select gating transistor 300. The source of the last floating gate transistor 305n is connected to the drain of the second select gating transistor 310. The drain of the first select gating transistor 300 is connected to the global bit line GBL 315. The source of the second select gating transistor 310 is connected to the source line SL 335.

As noted above the difference between the NAND configured flash memory cell and a NAND configured EEPROM is in the number (n) of NAND configured floating gate transistors 305a, 305b, ..., 305n−1, 305n serially connected. With a NAND configured flash memory cell in application having more permanent data requiring fewer program and erase cycles, there are 16 or 32 serially connected NAND configured floating gate transistors 305a, 305b, ..., 305n−1, 305n between the first select gating transistor 300 and the second select gating transistor 310. Alternately, in the NAND configured EEPROM with the application having short term data requiring greater program and erase cycles, there are fewer than 16 NAND configured floating gate transistors 305a, 305b, ..., 305n−1, 305n between the first select gating transistor 300 and second select gating transistor 310.

Figure 5B:
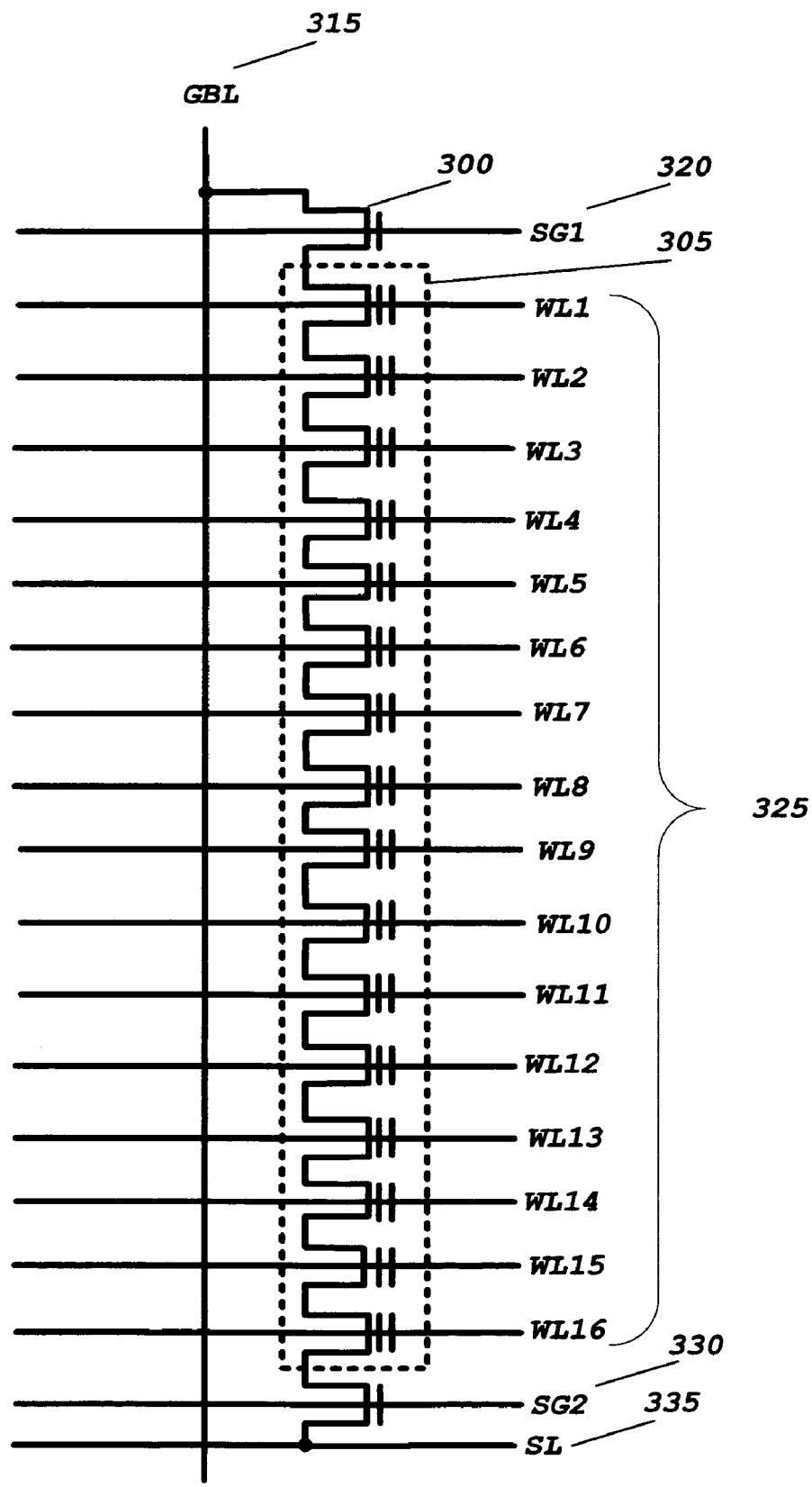
FIG. 5b is a schematic diagram of sixteen-transistor NAND configured flash EEPROM as incorporated in the combination volatile and nonvolatile memory integrated circuit of this invention.

Refer now to FIG. 5b for a discussion of the NAND configured EEPROM as incorporated in the combination volatile and nonvolatile memory integrated circuit of this invention. In the example of the NAND configured EEPROM sixteen of the NAND configured floating gate transistors 305a, 305b, ..., 305n−1, 305n of FIG. 5a are serially connected drain to source. The drain of the first floating gate transistor of the sixteen NAND configured floating transistors 305a, 305b, ..., 305n−1, 305n is connected to the source of the first select gating transistor 300 and the source of the last of the sixteen NAND configured floating gate transistors 305a, 305b, ..., 305n−1, 305n is connected to the drain of the second select gating transistor 310. As described above the drain of the first select gating transistor 300 is connected to the global bit line GBL 315 and the source of the second select gating transistor 310 is connected to the source line SL 335. The gate of the first select gating transistor 300 is connected to the first select gating line SG1 320 and the gate of the second select gating transistor 310 is connected to the second select gating line SG2 330. The gates of the sixteen NAND configured floating gate transistors 305 are connected to the word lines WL1, ..., WL16 325.

Refer back to FIG. 5a and to the table of FIG. 5c for a description of the programming and erasing of the n-transistor NAND configured nonvolatile memory cell of as incorporated in the combination volatile and nonvolatile memory integrated circuit of this invention. The global bit line GBL 315 is connected to a bit line voltage generator, the word lines WL1 325a, ..., WLn 325n are connected to a word line voltage generator, and the source line SL 335 is connected to a source line voltage generator. The first and second select gating lines SG1 320 and SG2 330 are connected to a select gating controller.

For programming the n-transistor NAND configured nonvolatile memory cell of as incorporated in the combination volatile and nonvolatile memory integrated circuit of this invention, the bit line voltage generator and thus the global bit line GBL 315 is set to the ground reference voltage (0V). The select gating controller set the first select gating line SG1 320 to the voltage level of the power supply voltage source $V_{DD}$ to activate the first select gating transistor 300. The select gating controller sets the second gating line SG2 330 to the ground reference voltage (0V) to deactivate the second select gating transistor 310. Since the second select gating transistor 310 is deactivated, the source line generator and thus the source line SL 335 may be either the voltage level of the power supply voltage source $V_{DD}$ or the ground reference voltage (0V). The bulk of the N NAND configured floating gate transistors 305a, 305b, ..., 305n−1, 305n is set to the voltage level of the ground reference voltage (0V). The word line voltage generator sets the first word line WL1 to the level of the moderate programming voltage level ($V_{pro}$) to the control gate of the first floating gate transistor 305a. The moderate programming voltage level ($V_{pro}$) is the voltage applied to control gate of those N NAND configured floating gate transistors 305a, 305b, ..., 305n−1, 305n above the selected floating gate transistor of the N NAND configured floating gate transistors 305a, 305b, ..., 305n−1, 305n. The moderate programming voltage level ($V_{pro}$) has to be larger than the largest threshold voltage $V_T$ of any of the N NAND configured floating gate transistors 305a, 305b, ..., 305n−1, 305n, which is typically more than +2.0V with a body-effect and in a typical application is from approximately +5.0V to +10.0. The voltage level (+5V to 10.0V) of moderate programming voltage level ($V_{pro}$) on those N NAND configured floating gate transistors 305a, 305b, ..., 305n−1, 305n above the selected floating gate transistor of the N NAND configured floating gate transistors 305a, 305b, ..., 305n−1, 305n is to guarantee that the program inhibit voltage of VDD-Vt will be successfully passed from the global bit line GBL 315 to the drain of the selected floating gate transistor 305j of the N NAND configured floating gate transistors 305a, 305b, ..., 305n−1, 305n and also helps boost the coupling voltage at the channel region of the selected flash cell 305j to enhance the program inhibit operation for unprogrammed cells in the same selected word line WL1 325a, ..., WLn 325n. For instance, the word line generator sets the word line WLj 325j connected to the selected floating gate transistor 305j of the N NAND configured floating gate transistors 305a, 305b, ..., 305n−1, 305n to the relatively high positive programming voltage (on the order of from approximately +15.0 to approximately +22.0V, preferably +18.0V). This voltages as shown for the selected floating gate transistor of the relatively high positive programming voltage cause a Fowler-Nordheim tunneling through the tunneling oxide in the channel between the source and drain of the selected floating gate transistor to the floating gate. The threshold voltage $V_T$ of the selected floating gate transistor of the N NAND configured floating gate transistors 305a, 305b, ..., 305n−1, 305n will be increased from −2.0V to above +2.0V.

The word line voltage generator sets those word lines WLj+1 325j+1, ..., WLN 325n and thus the control gates of the floating gate transistors 305j+1, ..., 305n−1, 305n to the ground reference voltage level (0V) or the moderate programming voltage level ($V_{pro}$) to enhance the program inhibit to prevent activation of the floating gate transistors 305j+1, ..., 305n−1, 305n. The voltage applied to deselected word lines WLj+1 325j+1, ..., WLN 325n and thus the control gates of the floating gate transistors 305j+1, ..., 305n−1, 305n is preferably moderate programming voltage level ($V_{pro}$), which is around ½ of the relatively high positive programming voltage.

To inhibit programming of the N NAND configured floating gate transistors 305a, 305b, ..., 305n−1, 305n unselected global bit lines (not shown), the bit line voltage generator sets the unselected global bit lines to the voltage level of the power supply voltage source $V_{DD}$. Since the first and second select gating lines SG1 320 and SG2 330, the word lines WL1 325a, ..., WLn 325n and the source line 335 are commonly connected, the voltage levels activate or deactivate those N NAND configured floating gate transistors 305a, 305b, ..., 305n−1, 305n as though those N NAND configured floating gate transistors 305a, 305b, ..., 305n−1, 305n were to be programmed. By setting the global bit line GBL 315 to the power voltage source the Fowler-Nordheim tunneling is prevented and the N NAND configured floating gate transistors 305a, 305b, . . . , 305n−1, 305n are not programmed.

As noted above, the select gating controller sets the second select gating line SG2 330 to the ground reference voltage level to deactivate the second select gating transistor 310 avoid any leakage of current from the global bit line GBL 315 during program operation. Further in the columns of N NAND configured floating gate transistors 305a, 305b, . . . , 305n−1, 305n that are to be inhibited from programming, the deactivation of the second select gating transistor 310 inhibit voltage (VDD-Vt) to prevent leakage through the second select gating transistor 310 to the source line SL 335. For those unprogrammed cells connected to the selected global bit line GBL 315 or in the selected word line WLj 325j, the inhibit voltage of VDD-Vt will be coupled to above +5V when +18V is coupled to the selected word line WLj 325j. The voltage drop of thin tunnel oxide between polycrystalline floating gate and P-type substrate will not have enough electric field, thus the tunneling effect will not occur and the cells will not be programmed. As a consequence, the threshold voltage $V_T$ of the N NAND configured floating gate transistors 305a, 305b, . . . , 305n−1, 305n of unprogrammed cells will remain as the erase-state of −2V.

For erasing the n-transistor NAND configured nonvolatile memory cell of as incorporated in the combination volatile and nonvolatile memory integrated circuit of this invention, the bit line voltage generator and thus the global bit line GBL 315 is set to the ground reference voltage (0V). The select gating controller set the first select gating line SG1 320 to the voltage level of the power supply voltage source $V_{DD}$ to activate the first select gating transistor 300. The select gating controller sets the second gating line SG2 330 to the power supply voltage source $V_{DD}$ to activate the second select gating transistor 310. The source line generator and thus the source line SL 335 is set to the voltage level of the ground reference voltage (0V). The bulk of the N NAND configured floating gate transistors 305a, 305b, . . . , 305n−1, 305n is set to the voltage level of the ground reference voltage (0V). The word line voltage generator sets the all the word lines WL1 325a, . . . , WLn 325n and thus the control gates of the nonselected floating gate transistors of the N NAND configured floating gate transistors 305a, 305b, . . . , 305n−1, 305n to the voltage level of the ground reference voltage (0V). The word line generator sets the word line WLj connected to the selected floating gate transistor 305j of the N NAND configured floating gate transistors 305a, 305b, . . . , 305n−1, 305n to the relatively high negative erasing voltage (on the order of from approximately −15.0 to approximately −22.0V, preferably −18.0V). This voltages as shown for the selected floating gate transistor of the relatively high negative erasing voltage causes a Fowler-Nordheim tunneling through the tunneling oxide in the floating gate to the channel between the source and drain of the selected floating gate transistor to remove charge from the floating gate. The threshold voltage $V_T$ of the selected floating gate transistor of the N NAND configured floating gate transistors 305a, 305b, . . . , 305n−1, 305n will be decreased from above +2.0V to −2.0V.

To inhibit erasure of cells within pages of a common block of n-transistor NAND configured nonvolatile memory cell of as incorporated in the combination volatile and nonvolatile memory integrated circuit of this invention, the unselected global bit lines, first and second select gating lines SG1 320 and SG2 330, the word lines WL1 325a, . . . , WLn 325n and the source line 335 are set to the voltage level of the ground reference voltage (0V). The Fowler-Nordheim tunneling is prevented and the N NAND configured floating gate transistors 305a, 305b, . . . , 305n−1, 305n are not erased.

Figure 6:
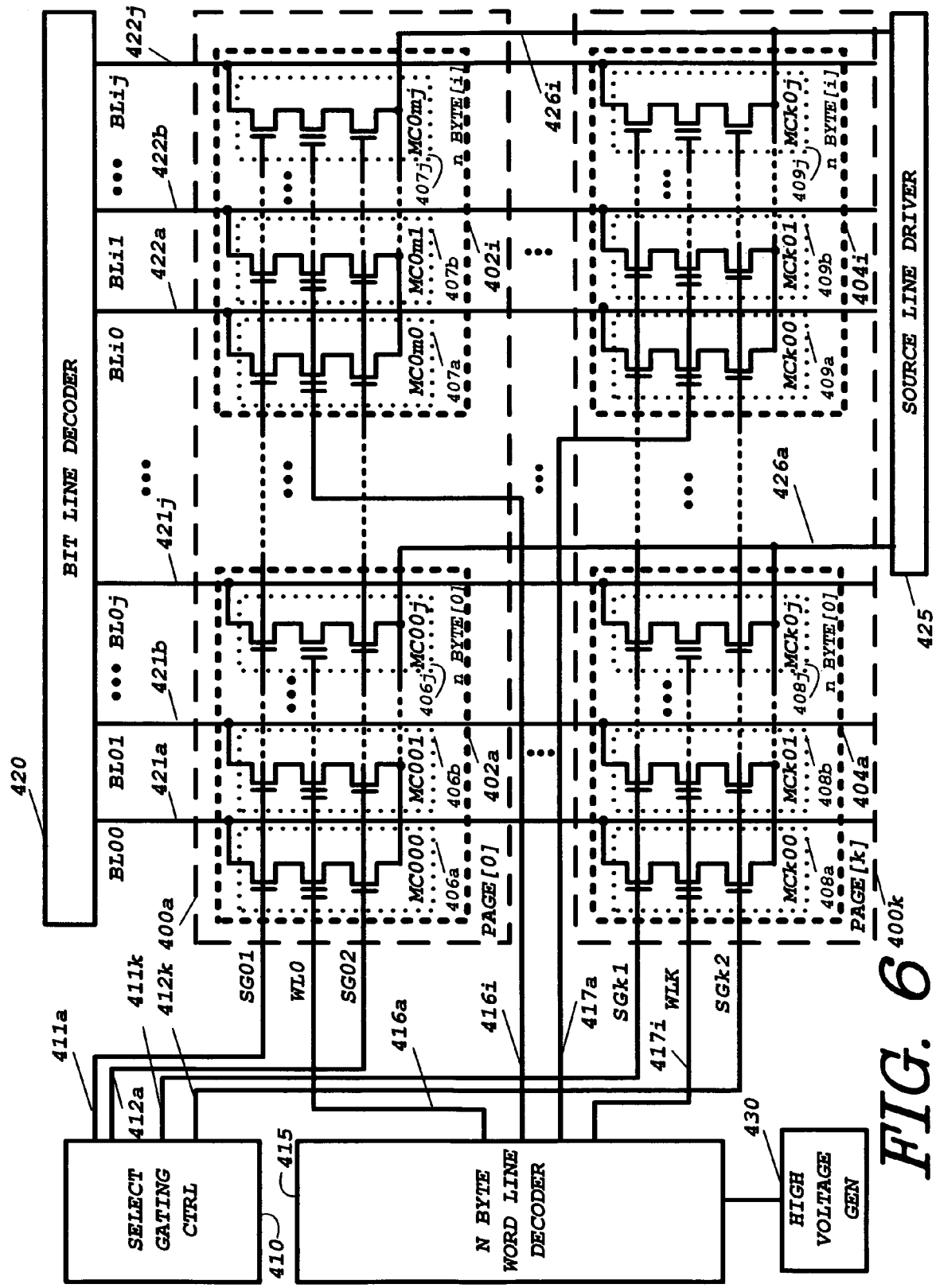
FIG. 6 is a schematic diagram a block or sub-array of a 3-transistor NAND configured EEPROM memory array as incorporated in the combination volatile and nonvolatile memory integrated circuit of this invention.

FIG. 6 illustrates a 3-transistor EEPROM memory array as incorporated in the combination volatile and nonvolatile memory integrated circuit of this invention organized by horizontal pages. Each horizontal page 400a, . . . , 400k is composed of a number of n Bytes 402a, . . . , 402i, and 404a, . . . , 404i that are oriented in the X direction of the select gate lines 411a, . . . , 411k and 412a, . . . , 412k. Each of the n Bytes 402a, . . . , 402i, and 404a, . . . , 404i contain a number of three transistor EEPROM memory cells 406a, . . . , 406j, 407a, . . . , 407j, 408a, . . . , 408j, and 409a, . . . , 409j. The three transistor EEPROM memory cells are structured and function as described in FIGS. 4a-4c. While the number of three transistor EEPROM memory cells 406a, . . . , 406j, 407a, . . . , 407j, 408a, . . . , 408j, and 409a, . . . , 409j would normally be eight within a Byte the number is not deterministic and may be any conveniently required number for instance 16 of the three transistor EEPROM memory cells 406a, . . . , 406j, 407a, . . . , 407j, 408a, . . . , 408j, and 409a, . . . , 409j for a two Byte application or 32 of the three transistor EEPROM memory cells 406a, . . . , 406j, 407a, . . . , 407j, 408a, . . . , 408j, and 409a, . . . , 409j for a four Byte application. Further, the number of Bytes 402a, . . . , 402i, and 404a, . . . , 404i may be any number dependent on the data requirements of the application.

The n Byte word line decoder 415 receives an address for the number of Bytes required to be transferred to or from the three transistor EEPROM memory array. The n Byte word line decoder, in many applications, decodes address to provide or receive 1, 2 or 4 Bytes for each data transfer. The n byte word line decoder 415 activates the appropriate word line 416a, . . . , 416i, and 417a, . . . , 417i to access the selected n Byte grouping 402a, . . . , 402i, and 404a, . . . , 404i.

The select gating controller 410 activates the select gates 411a, . . . , 411k, 412a, . . . , 412k to access the three transistor EEPROM memory cells 406a, . . . , 406j, 407a, . . . , 407j, 408a, . . . , 408j, and 409a, . . . , 409j of the selected n Byte grouping 402a, . . . , 402i, and 404a, . . . , 404i. The Bit line decoder 420 activates the bit lines 421a, . . . , 421j, 422a, . . . , 422j connected to the three transistor EEPROM memory cells 406a, . . . , 406j, 407a. . . . , 407j, 408a, . . . , 408j, and 409a, . . . , 409j of the selected n Byte grouping 402a, . . . , 402i, and 404a, . . . , 404i. The source line driver 425 activates the source lines 426a, . . . , 426i connected to the three transistor EEPROM memory cells 406a, . . . , 406j, 407a, . . . , 407j, 408a, . . . , 408j, and 409a, . . . , 409j of the selected n Byte grouping 402a, . . . , 402i, and 404a, . . . , 404i.

The program and erasure of the three transistor EEPROM memory cells 406a, . . . , 406j, 407a, . . . , 407j, 408a, . . . , 408j, and 409a, . . . , 409j are accomplished as described above. The high voltage generator 430 is a circuit that is formed in an isolated triple well structure. The high voltage generator 430 generates the large positive programming voltage (+18V) and the large negative erasing voltage (−18V) that are applied through the n Byte word line decoder 415 to the word line 416a, . . . , 416i, and 417a, . . . , 417i. As noted above, the smallest increment for programming and erasure can thus be an n Byte grouping 402a, . . . , 402i, and 404a, . . . , 404i with the inhibit process as described above in the table of FIG. 4c.

The time for programming and erasing of an N Byte grouping 402a, ..., 402i, and 404a, ..., 404i is typically less than 5 mS and preferably approximately 2.5 msec reserved for erase and 2.5 msec for program. The time for programming and erasure of a full horizontal page 400a, ..., 400k is maintained less than the 5 ms due to a low Fowler Nordheim current of approximately ~10 pA per cell, in program and erase operations.

Figure 7:
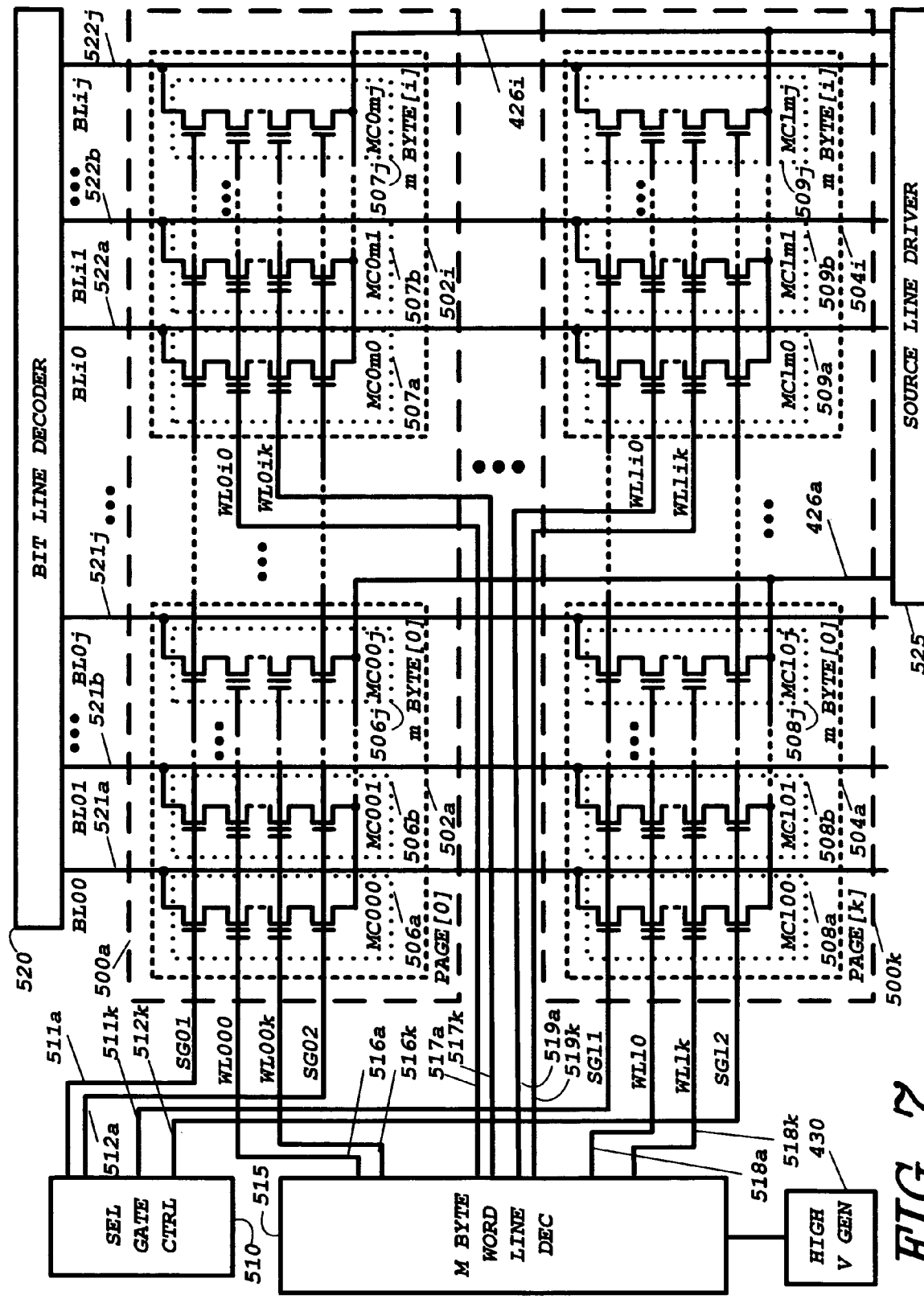
FIG. 7 is a schematic diagram a block or sub-array of a multiple-transistor NAND configured nonvolatile memory array as incorporated in the combination volatile and nonvolatile memory integrated circuit of this invention.

FIG. 7 illustrates an n-transistor NAND configured nonvolatile memory array as incorporated in the combination volatile and nonvolatile memory integrated circuit of this invention organized by horizontal pages. In FIG. 6, each NAND configured nonvolatile memory cells 406a, ..., 406j, 407a, ..., 407j, 408a, 408j, and 409a, ..., 409j is structured with three transistor only for the example. In FIG. 7, each NAND configured nonvolatile memory cells 506a, ..., 506j, 507a, ..., 507j, 508a, ..., 508j, and 509a, ..., 509j is composed of any arbitrary number (n) of transistors. Each horizontal page 500a, ..., 500k is composed of a number of M Bytes 502a, ..., 502i, and 504a, ..., 504i that are oriented in the X direction of the select gate lines 511a, ..., 511k and 512a, ..., 512k. Each of the M Bytes 502a, ..., 502i, and 504a, ..., 504i contain a number of n-transistor NAND configured nonvolatile memory cells 506a, ..., 506j, 507a, ..., 507j, 508a, ..., 508j, and 509a, ..., 509j as described in FIGS. 5a-5c. While the number of n-transistor NAND configured nonvolatile memory cells 506a, ..., 506j, 507a, ..., 507j, 508a, ..., 508j, and 509a, ..., 509j would normally be eight within a Byte the number is not deterministic and may be any conveniently required number for instance 16 of the three transistor NAND configured nonvolatile memory cells 506a, ..., 506j, 507a, ..., 507j, 508a, ..., 508j, and 509a, ..., 509j for a two Byte application or 32 of the three transistor NAND configured nonvolatile memory cells 506a, ..., 506j, 507a, ..., 507j, 508a, ..., 508j, and 509a, ..., 509j for a four Byte application. Further, the number of Bytes 502a, ..., 502i, and 504a, ..., 504i may be any number dependent on the data requirements of the application.

The M Byte word line decoder 515 receives an address for the number of Bytes required to be transferred to or from the n-transistor NAND configured nonvolatile memory array. The M Byte word line decoder 515, in many applications, decodes address to provide or receive 1, 2 or 4 Bytes for each data transfer. The M byte word line decoder 515 activates the appropriate word line 516a, ..., 516i, 517a, ..., 517i, 518a, ..., 518i, and 519a, ..., 519i to access the selected M Byte grouping 502a, ..., 502i, and 504a, ..., 504i.

The select gating controller 510 activates the select gates 511a, ..., 511k, 512a, ..., 512k to access the three transistor NAND configured nonvolatile memory cells 506a, ..., 506j, 507a, ..., 507j, 508a, ..., 508j, and 509a, ..., 509j of the selected n Byte grouping 502a, ..., 502i, and 504a, ..., 504i. The Bit line decoder 520 activates the bit lines 521a, ..., 521j, 522a, ..., 522j connected to the three transistor NAND configured nonvolatile memory cells 506a, ..., 506j, 507a, ..., 507j, 508a, ..., 508j, and 509a, ..., 509j of the selected n Byte grouping 502a, ..., 502i, and 504a, ..., 504i. The source line driver 525 activates the source lines 526a, ..., 526i connected to the n-transistor NAND configured nonvolatile memory cells 506a, ..., 506j, 507a, ..., 507j, 508a, ..., 508j, and 509a, ..., 509j of the selected M Byte grouping 502a, ..., 502i, and 504a, ..., 504i.

The program and erasure of the three transistor NAND configured nonvolatile memory cells 506a, ..., 506j, 507a, ..., 507j, 508a, ..., 508j, and 509a, ..., 509j are accomplished as described in the table of FIG. 5c above. The high voltage generator 530 is a circuit that is formed in an isolated triple well structure. The high voltage generator 530 generates the large positive programming voltage (+18V) and the large negative erasing voltage (-18V) that are applied through the M Byte word line decoder 515 to the word line 516a, ..., 516i, and 517a, ..., 517i. As noted above, the smallest increment for programming and erasure can thus be an M Byte grouping 502a, ..., 502i, and 504a, ..., 504i with the inhibit process as described above in the table of FIG. 5c.

Figure 8:
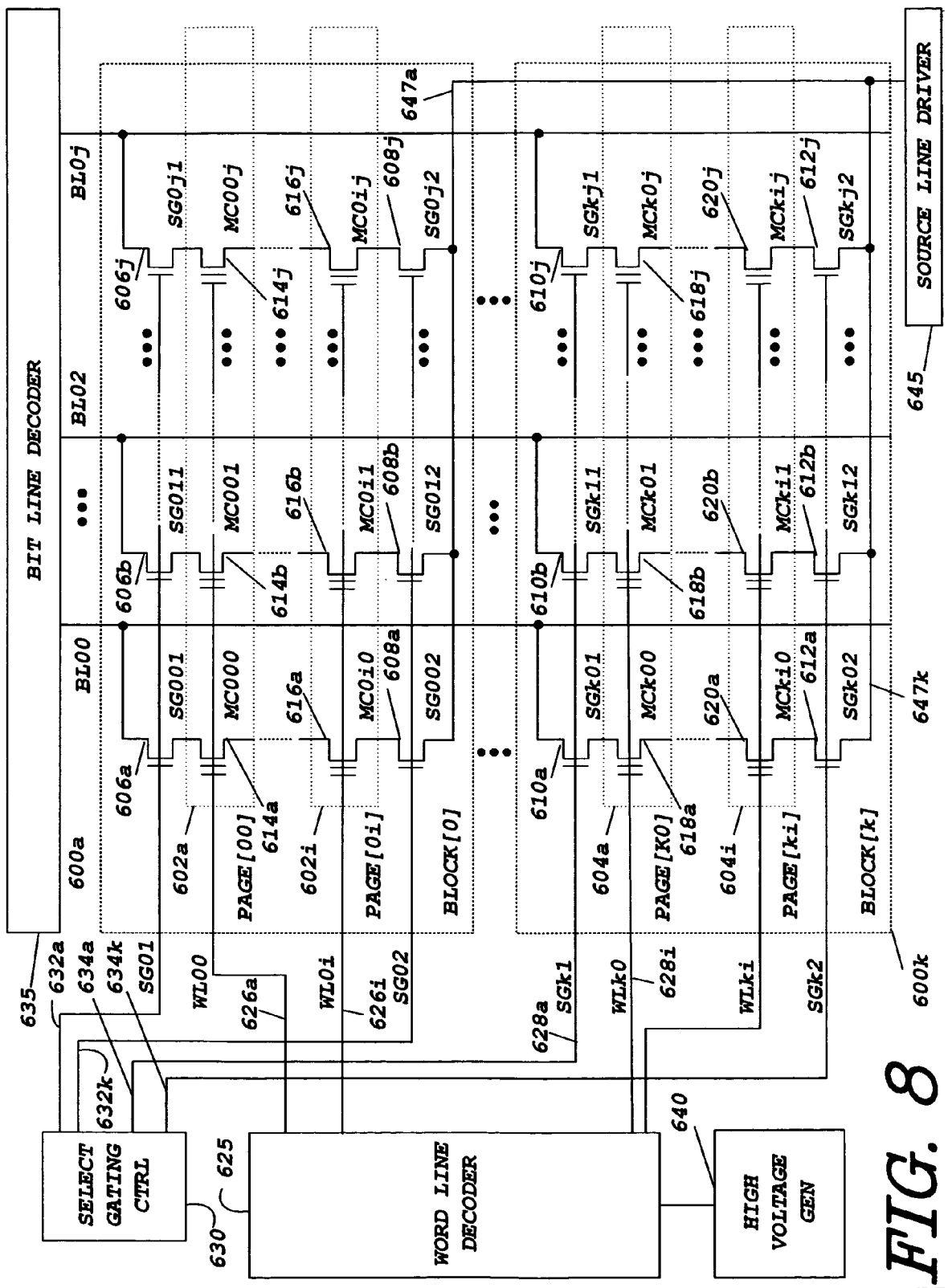
FIG. 8 is a schematic diagram a block or sub-array of a multiple-transistor NAND configured nonvolatile memory array as incorporated in the combination volatile and nonvolatile memory integrated circuit of this invention.

FIG. 8 illustrates a NAND configure flash nonvolatile memory array as incorporated in the combination volatile and nonvolatile memory integrated circuit of this invention, organized by horizontal pages. The NAND configured flash nonvolatile memory array is constructed of blocks 600a, ..., 600k of pages 602a, ..., 602i, 604a, ..., 604i of serially connected memory cells 614a, ..., 614j, 616a, ..., 616j, 618a, ..., 618j, 620a, ..., 620j. Each horizontal page pages 602a, ..., 602i, 604a, ..., 604i is composed of a number of the serially connected memory cells 614a, ..., 614j, 616a, ..., 616j, 618a, ..., 618j, 620a, ..., 620j that are oriented in the X direction of the select gate lines 632a, ..., 632k and 634a, ..., 634k. The number of serially connected memory cells 614a, ..., 614j, 616a, ..., 616j, 618a, ..., 618j, 620a, ..., 620j on each page 602a, ..., 602i, 604a, ..., 604i may be any number dependent on the data requirements of the application.

The word line decoder 625 receives an address for the page 602a, ..., 602i, 604a, ..., 604i required to be transferred to or from the NAND-type flash nonvolatile memory array. The word line decoder 625 activates the appropriate word line 626a, ..., 626i, and 628a, ..., 628i to access the selected page pages 602a, ..., 602i, 604a, ..., 604i of the serially connected memory cells 614a, ..., 614j, 616a, ..., 616j, 618a, ..., 618j, 620a, ..., 620j.

The select gating controller 630 activates the select gate lines 632a, ..., 632k, 634a, ..., 634k to access the serially connected memory cells 614a, ..., 614j, 616a, ..., 616j, 618a, ..., 618j, 620a, ..., 620j of the selected page 602a, ..., 602i, 604a, ..., 604i. The bit line decoder 635 activates the bit lines 636a, ..., 636j connected to the serially connected memory cells 614a, ..., 614j, 616a, ..., 616j, 618a, ..., 618j, 620a, ..., 620j. The source line driver 645 activates the source lines 647a, ..., 647k of the serially connected memory cells 614a, ..., 614j, 616a, ..., 616j, 618a, ..., 618j, 620a, ..., 620j.

The program and erasure of the serially connected memory cells 614a, ..., 614j, 616a, ..., 616j, 618a, ..., 618j, 620a, ..., 620j are accomplished as described in the table of FIG. 5c above. The high voltage generator 640 is a circuit that is formed in an isolated triple well structure. The high voltage generator 640 generates the large positive programming voltage (+18V) and the large negative erasing voltage (-18V) that are applied through the word line decoder 625 to the word line 626a, ..., 626i, and 628a, ..., 628i. As noted above, the smallest increment for programming and erasure can thus be a page 602a, ..., 602i, 604a, ..., 604i of the serially connected memory cells 614a, ..., 614j, 616a, ..., 616j, 618a, ..., 618j, 620a, ..., 620j.

The program and erase operation of the NAND type flash memory array as incorporated in the combination volatile and nonvolatile memory integrated circuit of this invention, may be for the whole NAND-type flash memory array, individual blocks 600a, . . . , 600k or individual pages 602a, . . . , 602i, 604a, . . . , 604i where the word lines 626a, . . . , 626i, and 628a, . . . , 628i of the array or selected blocks 600a, . . . , 600k, or selected pages 602a, . . . , 602i, 604a, . . . , 604i are coupled to the large negative voltage (−18V) generated by the high voltage generator 640, all bit lines 636a, . . . , 636k are coupled to ground and all select gate lines 632a, . . . , 632k, 634a, . . . , 634k are coupled to VDD and source lines 602a, . . . , 602i are coupled to ground. With these proper voltages set up, the threshold voltage Vt of the selected serially connected memory cells 614a, . . . , 614j, 616a, . . . , 616j, 618a, . . . , 618j, 620a, . . . , 620j in the NAND-type flash nonvolatile memory array will be decreased after erase with a predetermined erase time of 2-3 msec. And decreased after program with a predetermined program time 300 μS.

Figure 9:
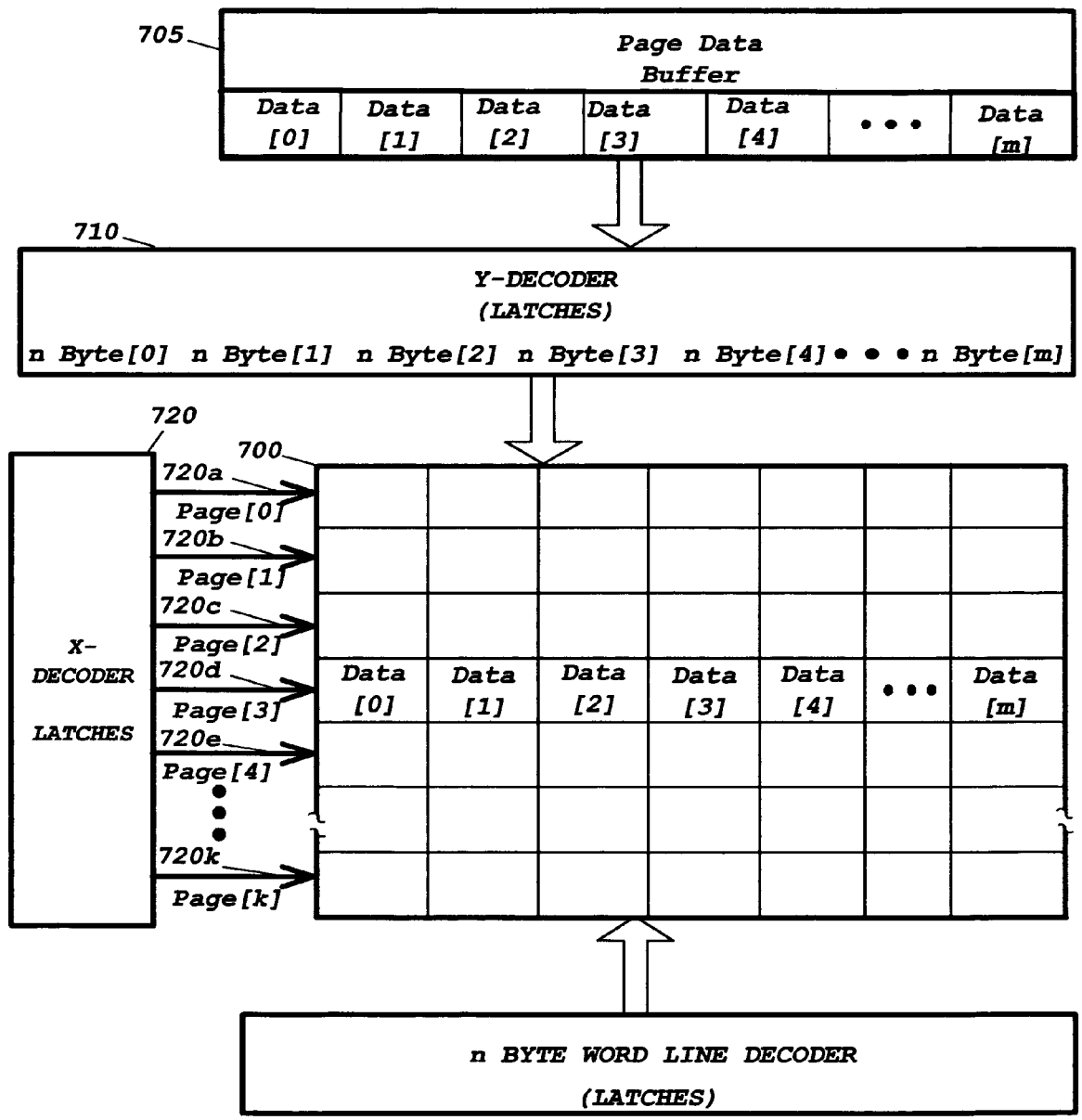
FIG. 9 is an architectural diagram of the decoding of the horizontal pages shown for the 3-transistor NAND configured EEPROM as incorporated in the combination volatile and nonvolatile memory integrated circuit of this invention.

FIG. 9 is an architectural diagram of the decoding of the horizontal pages of a three-transistor EEPROM of FIG. 6 of the present invention. The array 700 is divided into the n Byte groupings 402a, . . . , 402i, and 404a, . . . , 404i of FIG. 6 into which the n-Byte data (DATA[0], . . . , DATA[m]) is stored. The n-Byte data (DATA[0], . . . , DATA[m]) is transferred from external circuitry such as an embedded process or a smart card to a page data buffer 705. The address is transferred to X-decoder 720 which determines which of the page select lines 720a, . . . , 720k are to be accessed. The X-decoder 720 acts as the select gating control 410 of FIG. 6 to activate the select gating transistors of the EEPROM memory cells. In the two transistor EEPROM cell there is one select gating line and in the three transistor EEPROM cell there are two select gating lines per page select line 720a, . . . , 720k.

The Y-decoder 710 and n Byte-word line decoder 715 decode each address of the n Bytes to be accessed within each page. The Y-decoder activates the bit lines 421a, . . . , 421j, 422a, . . . , 422j of the EEPROM memory cells 406a, . . . , 406j, 407a, . . . , 407j, 408a, . . . , 408j, and 409a, . . . , 409j of FIG. 6 within the array 700. The n Byte word line decode 715 sets the word lines 416a, . . . , 416i, and 417a, . . . , 417i of FIG. 6 for the program and erasure of the n-Byte data (DATA[0], . . . , DATA[m]).

The latches of X-decoders 720, byte-word decoders 715 and Y-decoders 710 are set to store the numbers of n bytes selected for self-timed write operation. Therefore, the data stored in the page data buffer can be written to the corresponding location of the bytes in the page. It should be noted that, for parallel erase operation, the X-decoder 720, Y-decoder 710, and byte-word line decoder 715 may contain latches circuitry to provide the multiple selection of the word lines and bit lines for multiple bytes.

FIG. 10a illustrates the structure of a combination of three memories as integrated into one monolithic integrated circuit of the prior art for an application such as a smart card or a pluggable memory card. Combination memory 800 of the prior art includes a non-volatile 1-transistor ROM array 802 and 2-transistor FLOTOX EEPROM array 806 and one volatile 6-transistor SRAM array 804. The SRAM array 804 is used as a temporary storage area or central processor unit (CPU) scratch pad and does not require high density. The SRAM array 804 density requirement is around 1 KB. ROM array 802 contains permanently encoded digital data that is used to store the fixed CPU program or application programs. The EEPROM 806 is utilized for storing the byte-alterable data that must be retained when the power supply is disabled but also must be modified often and requires a high number of Program/Erase cycles (approaching 500K).

The traditional EEPROM array 806 requires a high-voltage of +16V crossing the cell's source and drain region for program operation. This high voltage has prevented the design of the floating gate transistor from shrinking to a channel length below 0.25 μm. That is why the FLOTOX EEPROM cell size is so big (100λ2) that a smaller Flash-based EEPROM cell is strongly needed as an alternative. Typically at the present time, the ROM array 802 density requirement is around 128 KB (1 Mb) and the EEPROM array 806 is around 64 KB (512 Kb).

In an integrated memory structure, the digital data, address, and control is often serialized for transfer into the combination memory integrated circuit 800 on a single I/O pin 810. The clock 812 and reset 814 are used for timing and initialization of the combination memory integrated circuit 800. The memory controller 808 generates the necessary address, data, and timing signals for accessing the ROM array 802, the low density SRAM array 804, and the FLOTOX EEPROM array 806 for reading, writing, programming, and erasing as appropriate. The power supply voltage source $V_{DD}$ 816 and the substrate biasing source $V_{SS}$ 818 provide the necessary voltages and currents for powering the combination memory integrated circuit 800.

Figure 10C:
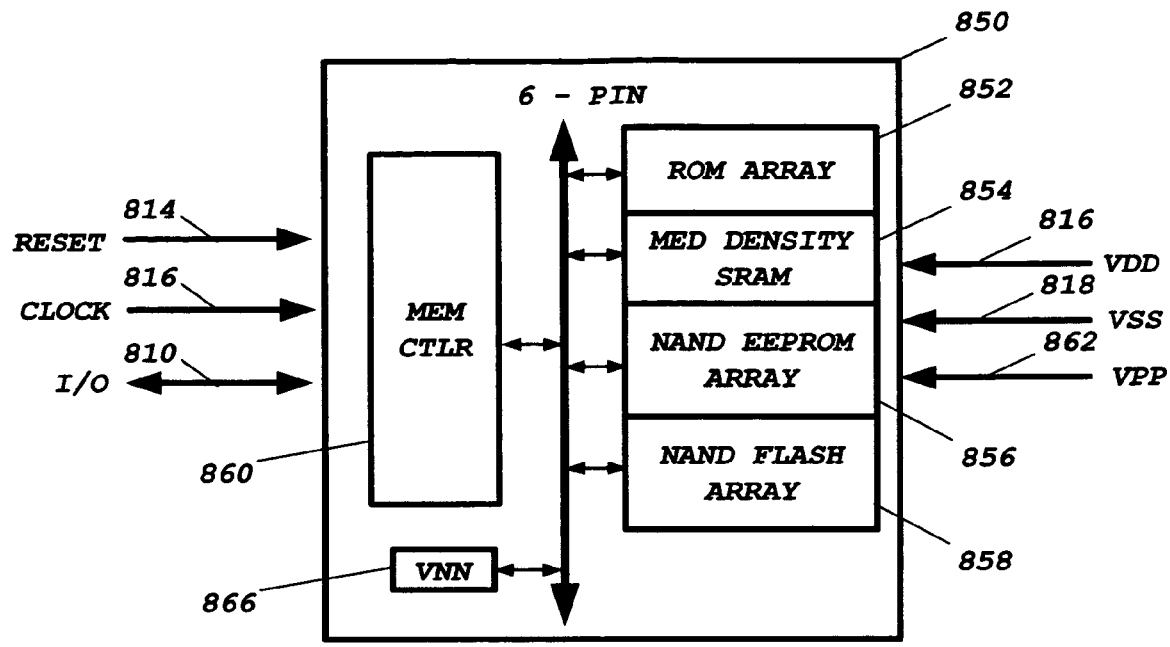
Figure 10D:
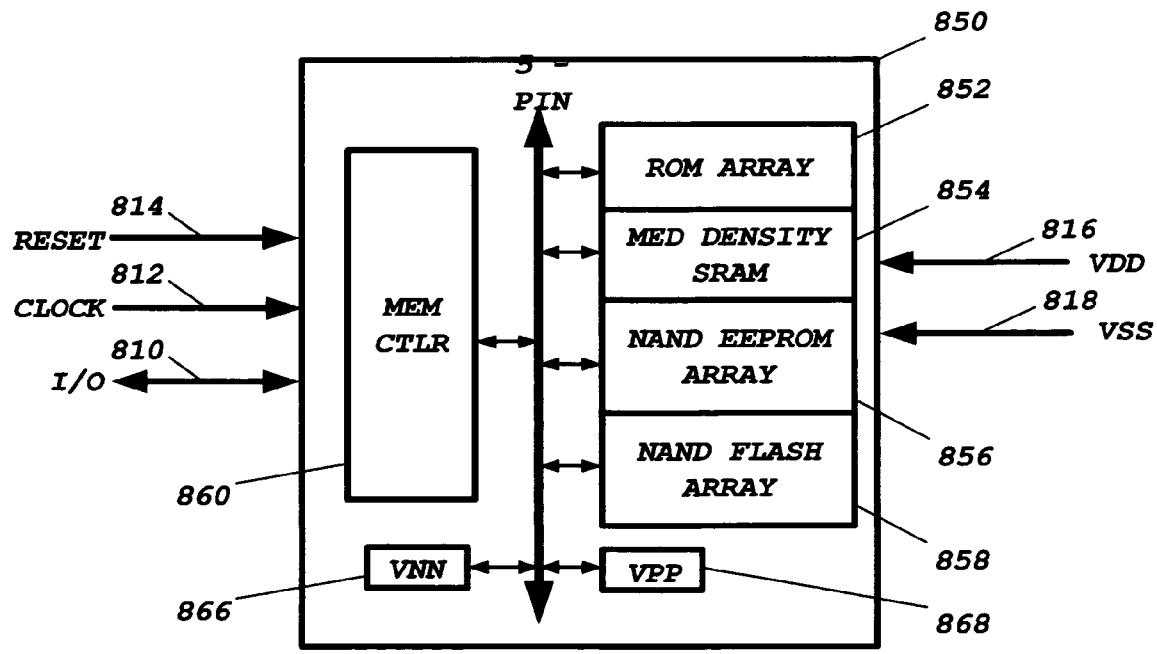

Refer now to FIGS. 10b-10d for a discussion of an implementation of the combination volatile and nonvolatile memory integrated circuit of this invention. The combination volatile and nonvolatile memory integrated circuit 850 includes a medium-high density SRAM array 854 combined with a ROM array 852, a NAND configured EPROM array 856, and a NAND configured flash memory array 858. The increase in the density of the SRAM array 854 from low to medium-high density provides a temporary or cache memory in addition to the scratch pad memory provided by a low density SRAM array of the prior art. The temporary or cache memory allows for the retention of digital data transferred from the nonvolatile memory arrays 852, 856, and 858 to the SRAM array 854. The caching of the memory in the SRAM array 854 permits faster execution of one or more application programs. The transfer of the digital data from the memory arrays 852, 856, and 858 is accomplished by the memory controller 860 directly from the ROM array 852, NAND configured flash memory array 856, and NAND-configured EEPROM array 858. The SRAM array 854 further receives temporary downloaded data and application program data transferred through the external I/O pin 810. The density of the SRAM array 854 may be on the order of kilobytes to megabytes. As described above the ROM array 802 is used to retained permanent digital data that can never be modified without replacement of the integrated circuit die.

The digital data, address, and control for the combination volatile and nonvolatile memory integrated circuit 850 is serialized for transfer on a single I/O pin 810. The clock 812 and reset 814 are used for timing and initialization of the combination volatile and nonvolatile memory integrated circuit 850. The memory controller 860 generates the necessary address, data, and timing signals for accessing the ROM array 852, the medium density SRAM array 854, NAND configured flash memory array 856, and NAND-configured EEPROM array 858 for reading, writing, programming, and erasing as appropriate. The power supply voltage source $V_{DD}$ 816 and the substrate biasing source $V_{SS}$ 818 provide the necessary voltages and currents for powering combination volatile and nonvolatile memory integrated circuit 852. The relatively high positive programming voltage VPP 862 and the relatively high negative erasing voltage VNN 864 allow the external strong high-voltages to replace the weak on-chip charge pumps. During erase operation, the relatively high negative erasing voltage VNN 864 is greater than −18V. During program, the relatively high positive programming voltage VPP 862 is greater than more than +18V and is applied as described above to FIGS. 5a-5c.

FIG. 10c illustrates the implementation of the combination volatile and nonvolatile memory integrated circuit if this invention where the relatively high negative erasing voltage VNN 864 pin is removed from the external pins to save one pin. The relatively high negative erasing voltage VNN is generated by a VNN charge pump 866 within the combination volatile and nonvolatile memory integrated circuit 850.

FIG. 10d illustrates the implementation of the combination volatile and nonvolatile memory integrated circuit if this invention where the relatively high positive programming voltage VPP 862 and the relatively high negative erasing voltage VNN 864 pins are removed from the external pins to save two pins. The relatively high positive programming voltage VPP and the relatively high negative erasing voltage VNN are generated by a VPP charge pump 868 and a VNN charge pump 866 within the combination volatile and nonvolatile memory integrated circuit 850.

Figure 11:
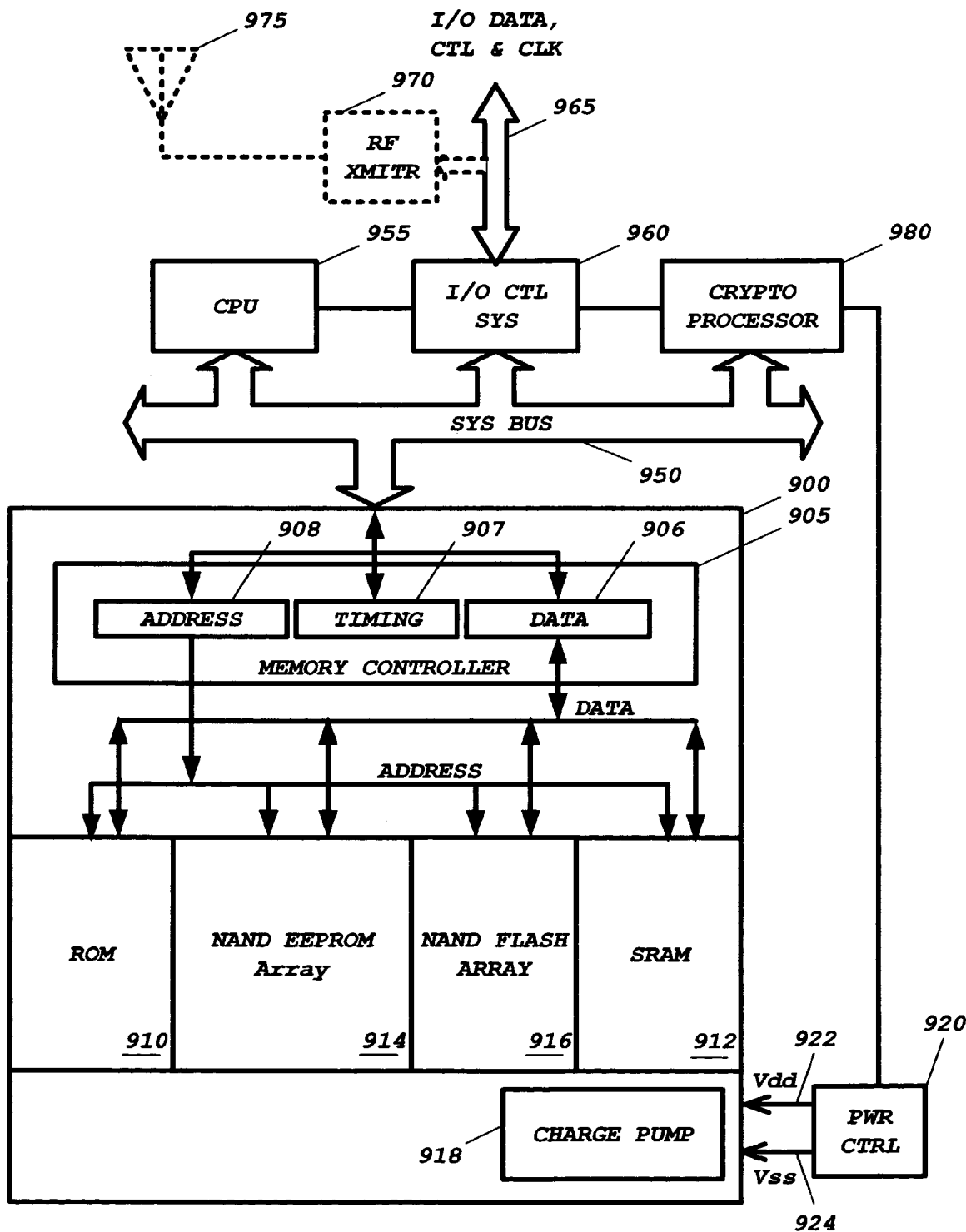
FIG. 11 is a block diagram of system on a chip incorporated in a smart card including a combination volatile and nonvolatile memory integrated circuit of the present invention including one ROM, SRAM, NAND configured flash memory, and NAND configured EEPROM.

FIG. 11 shows the physical structure of an embedded processor system-on-a-chip of this invention including a combination volatile and nonvolatile memory integrated circuit 900 The combination volatile and nonvolatile memory integrated circuit 900 includes the ROM array 910, the SRAM array 912, the NAND-configured EEPROM array 914, and the NAND configured flash memory array 916. The structure and function of the NAND-configured EEPROM array 914, and the NAND configured flash memory array 916 is as described in FIGS. 5a-5c. The ROM array 910 is as described in FIGS. 2a-2d and the SRAM array is as described in FIGS. 1a-1d.

Incorporated within the combination volatile and nonvolatile memory integrated circuit 900 is a high voltage charge pump 918 that develops the relatively high positive programming voltage VPP and the relatively high negative erasing voltage VNN. A memory controller 905 generates the appropriate flow of address, data and timing to control operations of the ROM array 910, the SRAM array 912, the NAND-configured EEPROM array 914, and the NAND configured flash memory array 916. The address decoder 908 receives the address from the system bus 950, decodes the address to generate the necessary signals to activate the selected ROM array 910, the SRAM array 912, the NAND-configured EEPROM array 914, or the NAND configured flash memory array 916 for reading, writing, programming, and erasing. The timing circuit 907 develops the necessary timings for the reading, writing, programming and erasing or the ROM array 910, the SRAM array 912, the NAND-configured EEPROM array 914, and the NAND configured flash memory array 916. The data control circuits 906 appropriately buffers and conditions the digital data for the reading, writing, programming, and erasing.

The combination volatile and nonvolatile memory integrated circuit 900 is connected to the system bus 950 which provides the address, data and control signals that are received by the memory controller 905. The power supply voltage VDD 922 and the ground or substrate reference voltage VSS 924 is transferred from the power control circuit 920. If the combination volatile and nonvolatile memory integrated circuit 900 does not have the charge pump 918 to develop the relatively high positive programming voltage VPP and the relatively high negative erasing voltage VNN, these voltages are generated in the power control circuit 920 and transferred to the combination volatile and nonvolatile memory integrated circuit 900 in a fashion similar to that described in FIG. 10b.

The smart card integrated system-on-a-chip has an embedded central processing unit (CPU) 955 and an Input/Output controller 960 connected to the system bus 950. The Input/Output controller 960 receives external data and command signals from an Input/Output interface 965. The Input/Output interface 965 maybe a connector with terminals that communicate with external circuitry or may be a radio frequency (RF) transmitter/receiver 970 connected to an antenna 975 to wirelessly communicate with the external circuitry. Further, in RFID types of applications the power controller 920 may be connected to the RF receiver to receive a portion of the RF energy received from the external circuitry to convert the RF energy to the power supply voltage VDD, ground or substrate reference voltage VSS, the relatively high positive programming voltage VPP and the relatively high negative erasing voltage VNN. In certain applications, the smart card may optionally include a cryptographic processor 980 for encrypting data such as biometric identification information data within the NAND-configured EEPROM array 914 or the NAND configured flash memory array 916.

Figure 12:
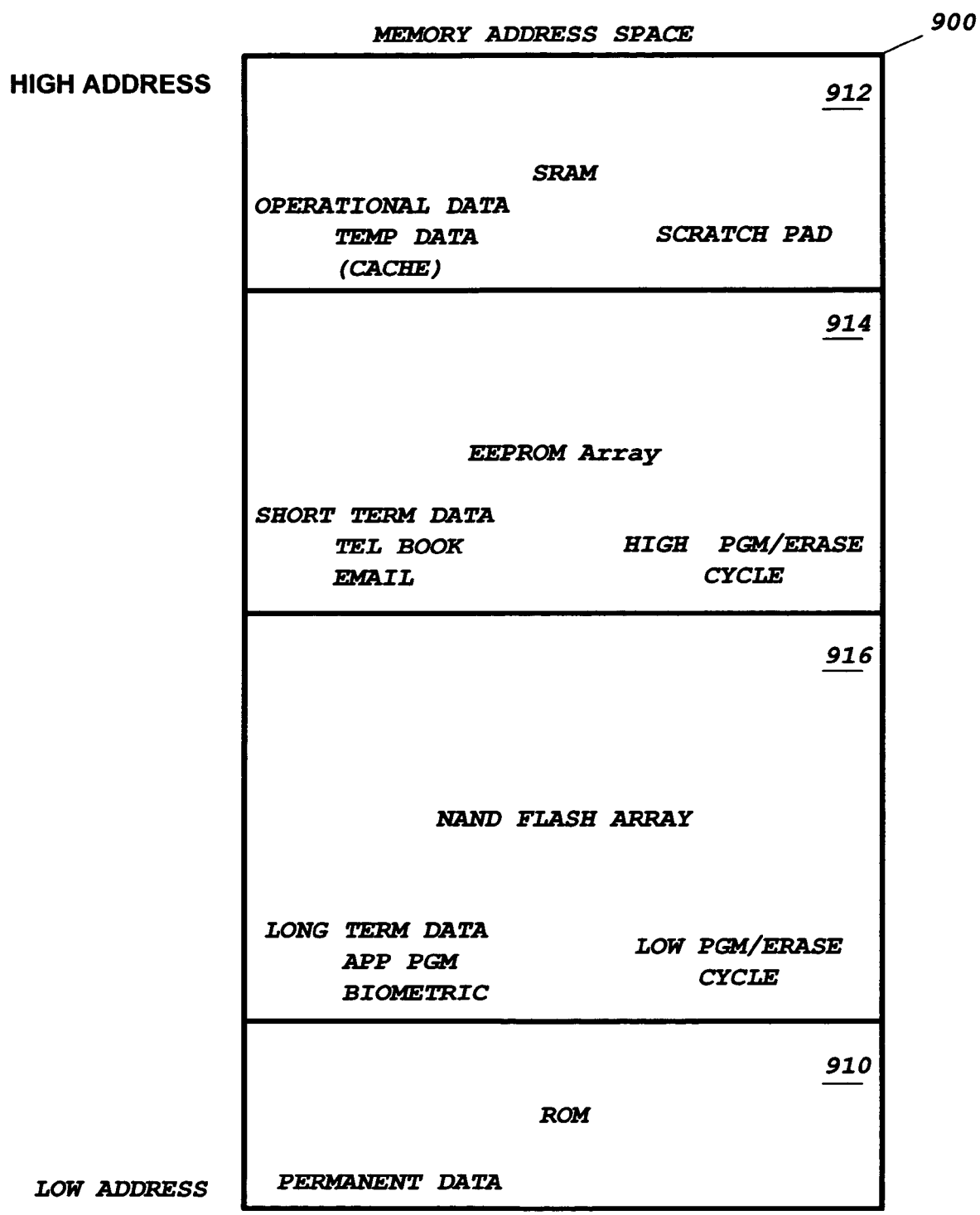
FIG. 12 is a diagram of the memory addressing arrangement of the combination volatile and nonvolatile memory integrated circuit of the present invention.

Referring to FIG. 12, the address space of the combination volatile and nonvolatile memory integrated circuit 900 is structured from the low address to the high address. The more permanent data is placed at lower address with the mask ROM array 910 being placed at the low address. The ROM array 910 contains the permanent data that can not be changed such as initialization program data. The next more permanent data is in the NAND configured flash memory array 916 that contains the data such as the application programs and the biometric identification information data. The NAND configured flash memory array 916 contains data that does not change often and thus requires a low number of program erase cycles (approximately 100 over the life of the memory).

The NAND-configured EEPROM array 914 is higher in the address space and contains more temporary data such as that used for telephone numbers and short email messages. The NAND-configured EEPROM array 914 contains data that may change more often and thus requires a high number of program and erase cycles (>500 k). The SRAM array 912 is placed at the higher address and retains the temporary operational or scratch pad data and data caching for download from the nonvolatile memories 910, 914, and 916 or from the external sources through the I/O control system 960 of FIG. 11. As is known, upon removal of the power supply voltage source $V_{DD}$ from the SRAM array 912, the data is destroyed and is non retrievable.

Figure 13:
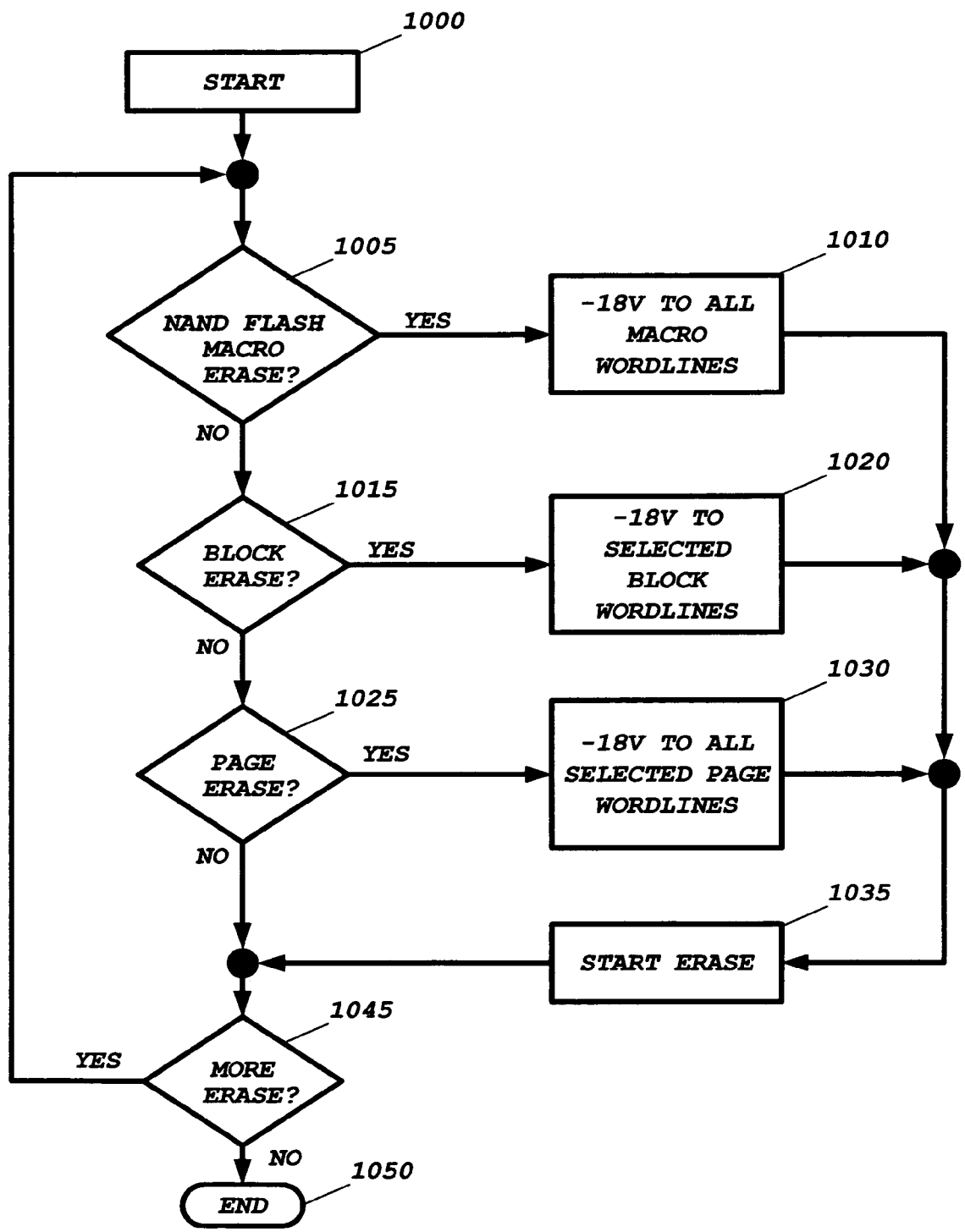
FIG. 13 is a flow chart of the method for erasing the NAND configured flash memory incorporated in the combination volatile and nonvolatile memory integrated circuit of the present invention.

FIG. 13 shows a flow chart of the erase operation of the NAND configured flash memory array as incorporated in the combination volatile and nonvolatile memory integrated circuit of this invention. There are three kinds of erase operations for the NAND configured flash memory array. The three erase operations are mainly designed to be performed in different sized segments of the NAND configured flash memory array. The first type of erase is referred as Macro erase and will erase the entire NAND configured flash memory array. The NAND configured flash memory array is comprised of a number (K) of blocks. The second type of erase is a BLOCK erase where a full selected block is erased. Each block of the NAND Flash memory array is comprised of a number of pages, preferably 16 pages. The third type of erase is called PAGE erase. Each page is comprised of an arbitrary number of bytes. Typically there are 128 or 256 bytes depending on the required density and tradeoff between read speed and silicon area. Since the NAND configured flash memory array uses Fowler Nordheim channel erase and channel program that consumes very little program current. Therefore, all three kinds of erases can be performed simultaneously and require typically less than 3 msec to complete. When the memory controller receives the command to start (Box 1000) an erase operation for NAND configured flash memory array, the memory controller examines (Box 1005) the erase command if the erasure is to be for the complete NAND Flash memory array. If the erasure is to be the complete macro of the NAND Flash memory array, the relatively large negative erase voltage of from approximately −15.0 to approximately −22.0V, preferably −18.0V is applied (Box 1010) to each of the word lines of the entire NAND Flash memory array and the erasure is started (Box 1035). Simultaneously all bit lines and source lines are coupled to the ground reference voltage level. The P-type substrate is permanently connected to ground reference voltage level. After a predetermined erase time of approximately 3.0 ms, the threshold voltage level $V_T$ of all the floating gate transistors of the cells NAND configured flash memory array will be erased to approximately −2.0V and erase operation will then be terminated. Usually, there is no need to do the pre-program and similarly, there is no need for erase verification.

If the entire NAND Flash memory array macro is not to be erased, the memory controller examines (Box 1015) whether a block of the NAND Flash memory array is to be erased. If a block of the NAND Flash memory array is selected, the appropriate address of the selected block will be enabled. The relatively large negative erase voltage is applied (Box 1020) to each of the word lines of the selected block of the NAND Flash memory array and the erasure is started (Box 1035). The magnitude of the relatively large negative erase voltage depends on the cell coupling ratio design as defined from second polycrystalline control gate layer to first polycrystalline layer of the floating gate. The rest of the deselected word lines of the deselected blocks will be coupled to ground reference voltage level and all global and local bit lines and source lines are coupled to ground reference voltage level. As described above, at predetermined erase time of approximately 3.0 ms, the threshold voltage level $V_T$ of all the floating gate transistors of the cells of the block of the NAND configured flash memory array will be erased to approximately −2.0V and erase operation will then be terminated. The threshold voltage level $V_T$ of all the floating gate transistors of the cells of the deselected blocks of the NAND configured flash memory array will not be affected and their threshold voltage $V_T$ will remain the same after erase operation. Again, the erase verification is not necessary.

If a block of the NAND Flash memory array is not to be erased, the memory controller examines (Box 1025) whether a page of the NAND Flash memory array is to be erased. If a page of the NAND Flash memory array is selected, the relatively large negative erase voltage is applied (Box 1030) to the single selected word lines of the selected page of the NAND Flash memory array and the erasure is started (Box 1035). The rest of the deselected word lines (15 word lines in the preferred implementation) of the selected block and the deselected word lines of the deselected blocks will be coupled to ground reference voltage level as are all bit lines and source lines. At the predetermined erase time of approximately 3 msec, the threshold voltage level $V_T$ of all the floating gate transistors of the selected page of the cells NAND configured flash memory array will be erased to approximately −2.0V and erase operation will then be terminated.

At the completion of the erasure sequence, the memory controller issues signals the CPU that the erasure is complete. The memory controller tests for more erasure commands (Box 1045) and if more erasure is to be completed the above process is repeated until all the erasure commands are executed, and the process ends (Box 1050)

Figure 14:
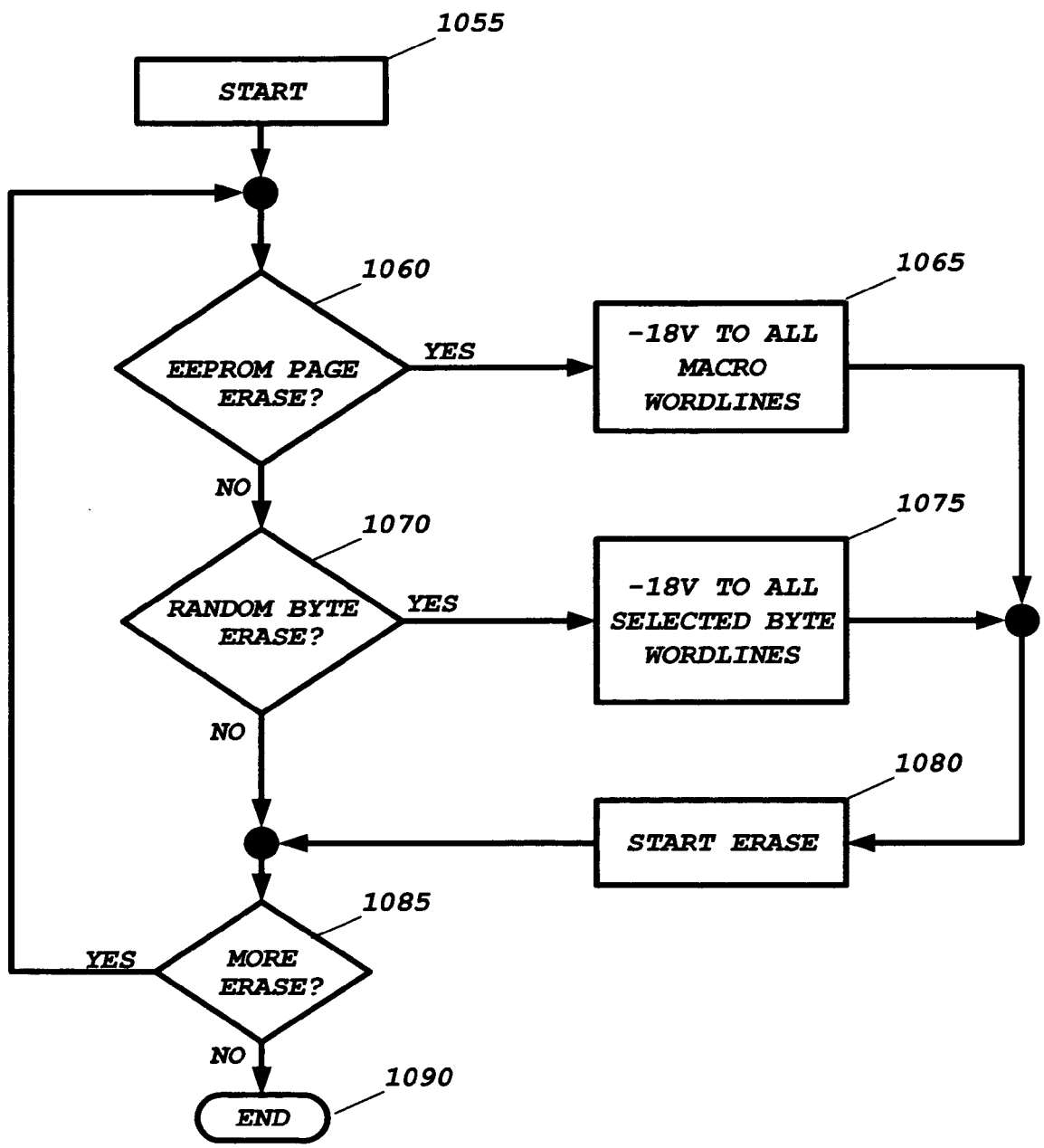
FIG. 14 is a flow chart of the method for erasing the NAND configured EEPROM incorporated in the combination volatile and nonvolatile memory integrated circuit of the present invention.

FIG. 14 shows a flow chart of the erase operation of the NAND configured EEPROM array as incorporated in the combination volatile and nonvolatile memory integrated circuit of this invention. The structure of the NAND configured EEPROM array is described in FIG. 6. The array may be structured as single byte alterable or multiple byte (2, 4, etc.) alterable and therefore the word line decoder structure is for addressing the appropriate byte size. For writing new data to the NAND configured EEPROM array, the new data is retained in a page buffer of the memory controller. Typically the page buffer has 128 bytes but this is dependent on the byte width as executed by the word line decoder.

Further, the NAND configured EEPROM array is comprised of a number of pages. Each page consists of a number of groups of bytes (1, 2, 4, etc.). The NAND configured EEPROM array has two types of erasure, page erase and random Byte grouping erasure. Since NAND configured EEPROM array uses Fowler Nordheim channel erase and channel program that consumes very little program current. Therefore, both types of erasure can be performed simultaneously and require typically less than 3 msec to complete. When the memory controller receives the command to start (Box 1055) an erase operation for NAND configured EEPROM array, the memory controller examines (Box 1060) the erase command. If a page of the NAND configured EEPROM array is selected, the relatively large negative erase voltage of from approximately −15.0 to approximately −22.0V, preferably −18.0V is applied (Box 1075) to the single selected word lines of the selected page of the NAND configured EEPROM array and the erasure is started (Box 1080). The rest of the deselected word lines of the deselected pages of the NAND configured EEPROM array will be coupled to ground reference voltage level as are all bit lines and source lines. At the predetermined erase time of approximately 3 msec, the threshold voltage level $V_T$ of all the floating gate transistors of the selected page of the cells NAND configured EEPROM array will be erased to approximately −2.0V and erase operation will then be terminated.

If when the memory controller examines (Box 1060) the erase command and it is not for a complete page, the memory controller examines (Box 1070) the erase command if the erasure is for a group of bytes (1, 2, 4, etc.) of the NAND configured EEPROM array. If the erasure is for a group of bytes, the relatively large negative erase voltage is applied (Box 1065) to the single selected word lines of the selected group of bytes of the NAND configured EEPROM array and the erasure is started (Box 1080). The rest of the deselected word lines of the nonselected groups of bytes of the page and the deselected pages of the NAND configured EEPROM array will be coupled to ground reference voltage level as are all bit lines and source lines. At the predetermined erase time of approximately 3 msec, the threshold voltage level $V_T$ of all the floating gate transistors of the selected page of the cells NAND configured EEPROM array will be erased to approximately −2.0V and erase operation will then be terminated.

At the completion of the erasure sequence, the memory controller issues signals the CPU that the erasure is completed. The memory controller tests for more erasure commands (Box 1085) and if more erasure is to be completed the above process is repeated until all the erasure commands are executed, and the process ends (Box 1090)

FIG. 11 shows a flow chart for downloading or moving more permanent data such as program data or more permanent application data such as biometric information data into the SRAM array from the ROM array, NAND configured flash memory array or NAND configured EEPROM array. Commands clocked into the on-chip command register and decoder of the memory controller from the I/O control system in a smart card or from external circuitry in a combination volatile and nonvolatile memory integrated circuit packaged separately. The command for movement of data from the nonvolatile memory to the volatile memory would be analogous to a move operation of an assembly language for a microprocessor, digital signal processor, or microcontroller.

Figure 15:
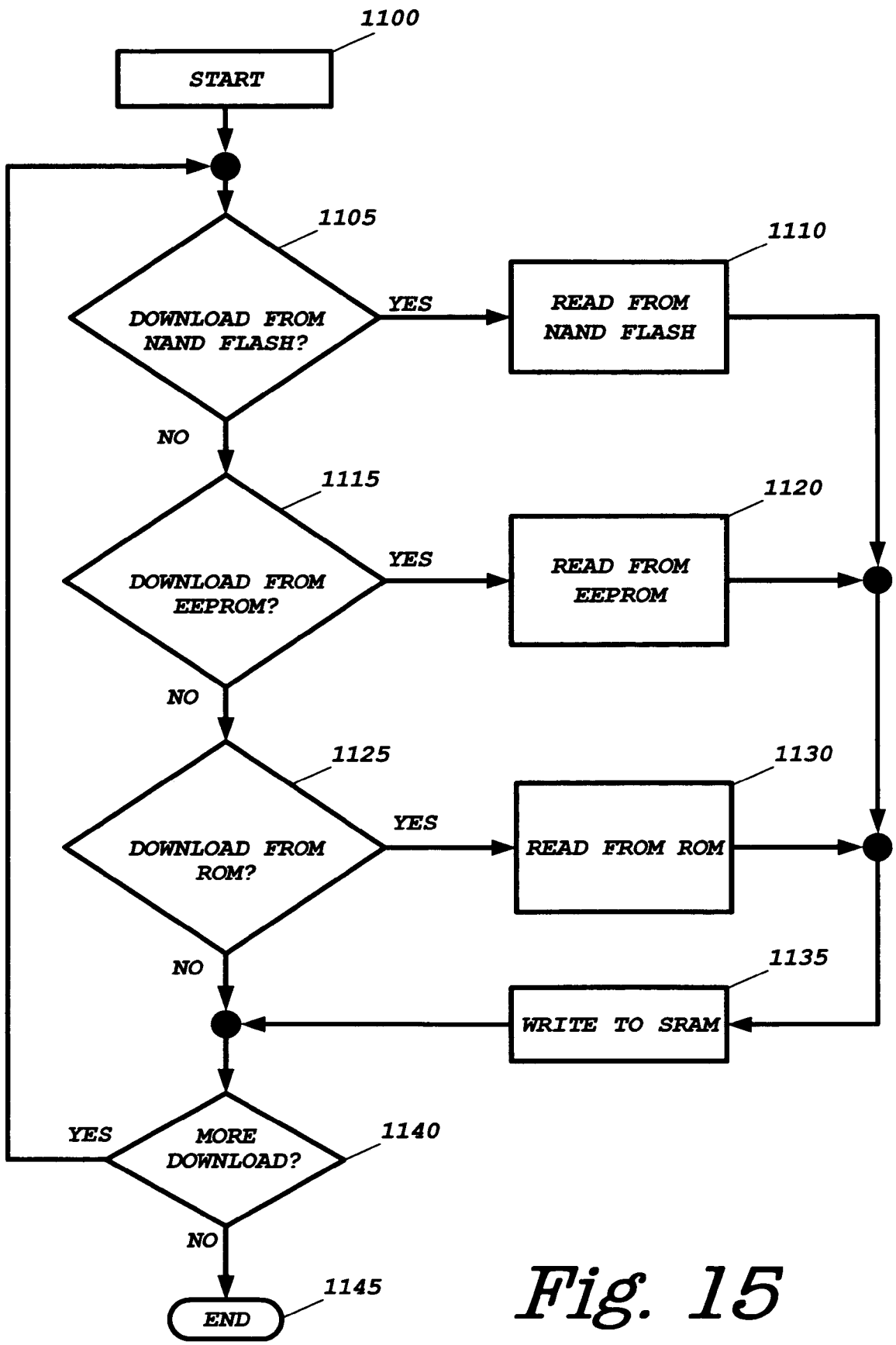
FIG. 15 is a flow chart of the method for transferring data from the nonvolatile memory components to the volatile memory components of the combination volatile and nonvolatile memory integrated circuit of the present invention.

Referring to FIG. 15, the move data command is decoded and the process for the transfer of the data from the nonvolatile memory to the volatile memory array begins (Box 1100). The source of the transfer is examined whether the transfer is from the NAND configured flash memory array (Box 1105), the NAND configured EEPROM array (Box 1115), or the ROM array (Box 1125). If the data is to be transferred from the NAND configured flash memory array, the data is read (Box 1110) from the NAND configured flash memory array and written (Box 1135) into the SRAM array. If the data is to be transferred from the NAND configured EEPROM array, the data is read (Box 1120) from the NAND configured EEPROM array and written (Box 1135) into the SRAM array. If the data is to be transferred from the ROM array, the data is read (Box 1130) from the ROM array and written (Box 1135) into the SRAM array. The amount of data to be moved is examined (Box 1140) and if there is more data to be transferred the process as described is repeated. If there is no more data to be transferred the process is ended (Box 1145)

An example of this process is the transfer of an application program to be read from the NAND configured flash memory array that may have a higher priority than more temporary data from the NAND configured EEPROM array. If the data is application program data from the ROM array or NAND configured flash memory array, the data is read from the ROM array or NAND flash memory array in parallel and then written into the predetermined locations of the SRAM array. If the SRAM array has a density of 128K bits and the application program is 100K bits, the data is read in units of a byte (x8) or a word (x16) into a data bus of the combination volatile and nonvolatile memory integrated circuit and then written into the SRAM array in units of the same size. If the data bus is shared by EEPROM array, flash memory array, SRAM array and ROM array, then the data controller must provide the necessary buffering and timing between the EEPROM array and the SRAM array so as to avoid data contention. A simple way is to have respective output buffers in each memory controlled by a control signal OEB (output enable bar). Each time, the whole system only allows one output buffer to be enabled when the corresponding output enable (OEB) is coupled to low and the output enable (OEB) of the other arrays of the combination volatile and nonvolatile memory integrated circuit are coupled to power supply voltage source $V_{DD}$. Alternately, the memory controller may have dedicated address, timing and data circuits and bus interconnections to automatically transfer the data from the selected memory to the desired memory. The memory controller would then have appropriate buffering to insure the timings of the read, writing, programming, and erasing.

The size of data within the nonvolatile memory array to be transferred will determine the time required to download the data into SRAM array. SRAM array as incorporated in the combination volatile and nonvolatile memory integrated circuit of this invention is divided into several sub-arrays to temporarily store the data from each of the possible sources—the NAND configured flash memory array, the NAND configured EEPROM array, the ROM array, and the I/O control system. In real operation, an application program data retained in the NAND configured flash memory is normally transferred first, and requires a longer period of time depending on the quantity of program data to be transferred. An example of a transfer of data from a NAND configured flash memory array to the SRAM is shown in the calculations listed below:

1. The downloaded application program size from NAND configured flash memory array: 100 Kb.
2. The downloaded byte-alterable data size from NAND-based EEPROM: 8 Kb.
3. SRAM array write speed in byte: 20 nsec/per byte.
4. NAND configured flash memory array read speed for a page: 20 μsec/page.
5. NAND configured EEPROM array read speed for page: 200 μsec/page.
6. Assumption: page size of NAND configured flash memory array and NAND configured EEPROM array is identical at 1 KB (8 kb).
7. Assumption: set up time is 10 μsec.
8. Total time (T) required to transfer (100 Kb NAND configured flash memory+8 Kb NAND configured EEPROM array) into SRAM array is:

$$T=[20 \text{ μsec}+(100K/8)\times 20 \text{ nsec}(100 \text{ KB/8})]+ [20 \text{ μsec}+(1 \text{ KB/8})\times 20 \text{ nsec}]+\text{setup time } (T_s)$$

$$T_s = \sim [20 \text{ μsec}+250 \text{ μsec}]+[20 \text{ μsec}+20 \text{ μsec}]+10 \text{ μsec}$$

$$T=320 \text{ μsec}$$

The calculation as shown demonstrates that a transfer of the program and data from two nonvolatile memory arrays into the SRAM array it takes less than 400 μsec to complete.

An application of a smart card incorporating a combination volatile and nonvolatile memory integrated circuit is a biometric identification card, or biometric passport card, or a multiple application card. When a biometric identification card or biometric passport card is used, the person who uses the card has to physically present the card to a card reader and biometric data reader. The biometric data reader will read all different kinds of biometric, personalized digital data from the physical body of the card carrier. The data includes fingerprints, facial pictures, iris, palm prints, handwriting signatures, DNA, X-rayed pictures of teeth and others. For increased security, it is preferable to increase the number of fingerprints and facial picture X-ray teeth angles and the forms of handwritten signatures. The first set of biometric data taken from the biometric data reader is stored in one dedicated location of the SRAM array. Next, the second set of biometric personalized data corresponding to the first set are now read out from either NAND configured flash memory array or NAND configured EEPROM array as incorporated in the smart card. Lastly, these two sets of biometric data are now compared against each other. If there is any discrepancy between the data from the biometric sensors of the biometric data read and the data retained by the nonvolatile memory of the combination volatile and nonvolatile memory integrated circuit, the system will immediately report the discrepancy. As a result, the secure usage of the card is guaranteed. In real system operation, the biometric data with the top priority is compared first. Unlike prior art which use the large NOR-Flash and FLOTOX EEPROM cells to store the biometric and personalized data, the combination volatile and nonvolatile memory integrated circuit of this invention allows the largest biometric data to be stored using the most compact sizes of NAND configured flash memory array and NAND configured EEPROM array instead. Besides using NAND configured flash memory arrays to store assorted varieties of biometric or personalized data, the on-chip NAND configured flash memory array can be used to store diverse application programs rather than using NOR-type flash or EEPROM to store as used in most prior art. The trend is to store more than 30 application programs. The application programs can be flexibly transferred into the NAND configured flash memory array from the external Input/Output interface after the smart card has been issued to a person for usage. Therefore, the smart card as configured of this invention can become more popular in usage than smart card configurations of the prior art.

In a smart card application, the commands are normally transferred serially into the on-chip command register and decoder first from the external I/O system during the normal operation. It is assumed that a combination volatile and nonvolatile memory integrated circuit card incorporated in a smart card, enough non-volatile memory sufficient to store all possible biometric and personalized data. When a person carrying the smart card travels with it to several destinations, the facilities and devices of the smart card readers in each destination may vary from the other destinations. Since the smart card contains the highest number of biometric or personalized data, the person carrying the smart card can determine the type of biometric data required by the reader and flexibly select the type of biometric data to be retrieved from the card for transfer to the card reader. Alternately, the card reader may have sufficient capability to search for the required biometric data. That means some of the biometric data evaluation can be skipped depending on the level of security set. The amount and types of biometric data analyzed can be flexibly increased or reduced, dependent upon the types of card reader used and the level of security required by the destination. Note, the personalized or biometric data can be stored either in NAND configured flash memory array or the NAND configured EEPROM array. For those data requiring P/E cycles less than 100, it can be stored in NAND configured flash memory array. It is preferable for each type biometric data to have a dedicated portion of the NAND configured nonvolatile memory dedicated to the data. For example, each of the ten fingerprints is defined to have the same density of 1 KB. Under this definition, then each fingerprint can be stored in one dedicated block of 1 KB of NAND configured flash memory array. Then, ten fingerprints will require ten dedicated NAND blocks.

The combination volatile and nonvolatile memory integrated circuit incorporating NAND configured flash memory arrays and NAND configured EEPROM arrays provide faster read speeds and smaller die sizes that are required for future memory cards and smart card applications such as the SIM-card, and Java-card. Table 1 below illustrates the cell area occupied by the traditional NOR Flash memory cells, the FLOTOX EEPROM cell versus the ROM cell, SRAM cell, NAND configured flash memory cell, and NAND configured EEPROM cell as incorporated in the combination volatile and nonvolatile memory integrated circuit of this invention:

TABLE 1

| Memory | ROM 1-T | FLOTOX-EEPROM 2-T | NOR-Flash 1-T | NAND-Flash 1-T | NAND-EEPROM 3-T | SRAM 6-T |
|---|---|---|---|---|---|---|
| Cell size ($\lambda^2$) | 8 | 100 | 10 | 4 | 18 | 130 |

For a smart card application, where the central processing unit has a 32 bit structure, the density requirements of the ROM array and EEPROM array is more than 4 Mb in the present structure. Based on recent studies, the 4 Mb memory density is not 100% used for traditional byte-alterable data. It may be assumed that 3 Mb out of the 4 Mb of EEPROM is used for non-byte-alterable data and can be replaced by NAND configured Flash memory. The details of area reduction in cell array and byte-word line decoders are calculated below. The remaining 1 Mb out of the 4 Mb EEPROM is replaced by NAND configured 3-transistor EEPROM for storing byte-alterable data. Since the NAND configured EEPROM cell size is $18\lambda^2$ and NAND configured flash memory cell is $4\lambda^2$ from Table 1, the saving in pure cell size is $14\lambda^2$. Therefore the area saving in cell array is denoted by the area reduction below, assuming 0.18 µm technology is used. The area reduction (A–) in substituting the NAND configured flash memory cell for the NAND configured EEPROM cell in memory only is shown as 1. $A{-}=3M\times14\lambda^2=36\ M\lambda^2=42\times10^6 0.18\times0.18\ um^2=1.3608\ mm^2$ 2. If the area overhead of the byte-word line decoders is included and the effective NAND 3-transistor EEPROM cell size is estimated at 2 times, then the total area reduction (TA–) is listed below.

$TA{-}=\frac{1}{2}\times3M\times14^2=21\times10^6\times0.18\times0.18\ um^2=0.6804\ mm\lambda^2.$ A typical 1 Mb SRAM array block size from one cell library provider (0.18 µm)=3.1 mm². From the rough calculations above, it becomes clear that using NAND configured Flash to store non-byte-alterable data has a larger savings in silicon as the NAND configured Flash density increases. The details are further calculated in Table 2 below.

TABLE 2

| Mem Tech µm | NAND Flash memory replace NAND EEPROM Area saving (mm²) | 6-T SRAM Block size (mm²) | Chip Area Δ (mm²) | Flash Array Area (mm²) | EEPROM Array Area (mm²) | Total Mem Δ (mm²) |
|---|---|---|---|---|---|---|
| 0.18 | 0.2 (512Kb) | 3.101 (512Kb) | +2.801 | | | |
| | 0.4 (1Mb) | 1.550 (256Kb) | +1.150 | | | |
| | 0.8 (2Mb) | 0.775 (128Kb) | −0.025 | | | |
| | 1.6 (4Mb) | 1.550 (256Kb) | +0.050 | | | |
| | 3.2 (8Mb) | 1.550 (256Kb) | −1.65 | 1.04 | 4.16 | 6.75 |
| | 3.2 (8Mb) | 0.775 (128Kb) | −2.425 | 1.04 | 4.16 | 5.975 |
| 0.13 | ~1.6 (8Mb) | ~1.55 (512Kb) | −0.05 | | | |

As seen from Table 2, the area savings of NAND configured EEPROM replacing the NAND configured EEPROM for storing non-byte-alterable data, 6-transistor SRAM array, chip area changes, NAND configured flash memory array area, 3-transistor NAND configured EEPROM array area and total die size change are shown. Table 2 shows the area increase or decrease based on memory density and process technology. Only two technologies of 0.18 µm and 0.13 µm are demonstrated for comparison. The density of NAND configured flash memory varies from 512 Kb to 8 Mb, while the density of SRAM array includes 128 Kb to 512 Kb. In the chip area column, the positive and negative signs means area increase and area decrease for each memory combination respectively. For instance, using 512 Kb NAND configured flash memory to replace the same-density 3-transistor NAND configured EEPROM array along with 512 Kb SRAM array in 0.18 um technology, the memory area savings in the nonvolatile memory portion of the combination volatile and nonvolatile memory integrated circuit is 0.2 mm² but the volatile memory increases by 3.101 mm² because 512 Kb SRAM array area is much larger than the 512 Kb NAND configured flash memory. If SRAM array is used to fully download the NAND configured flash memory program, the chip area is increased by +2.801 mm².

As shown in Table 2, when 4 Mb NAND configured flash memory is used to replace 3-transistor NAND configured EEPROM, the saving in silicon is almost equivalent to the memory size of 6-transistor 256 Kb SRAM array. Assuming the SRAM array density of 128 Kb is adopted as the building VM block along with the NVM blocks of NAND configured flash memory and NAND configured EEPROM, the memory size of 128 Kb SRAM array has to be larger than the minimum size spec of each or a few application programs transferred from the on-chip NAND configured flash memory. The reason that the SRAM array memory density must be larger than the defined size of downloaded memory of NAND configured flash memory is because of the additional memory capacity in SRAM array needed. It is needed as data storage coupled from byte-alterable NAND configured EEPROM, as program storage in any forms coupled from external I/O pin, as data storage coupled from the remaining blocks of NAND configured flash memory and as ordinary CPU scratch pad during CPU program execution. Based on the calculated results shown in Table 2, a preferable memory combination is comprised of a 8 Mb NAND configured flash memory and 128 Kb SRAM array with a big optimized area savings of 2.425 mm². The SRAM array density should be adjusted to be large enough to fit the size of at least one or a few regular application programs during normal Java card applications. If 64 Kb SRAM array is the basic unit of application program, then 8 Mb of NAND configured flash memory can store up to 64 application programs in Java card applications. If the memory size of one application takes two 64 Kb, then the total allowed number of programs can be 32. The whole array of NAND configured flash memory can be partitioned into several sub-arrays. Similarly, the whole NAND configured EEPROM can be divided into sub-arrays for storing different independent data. SRAM array memory is also used to store the byte-alterable data downloaded from the on-chip NAND configured EEPROM at the same time to allow simultaneous read and write among independent blocks of NAND configured flash memory and NAND configured EEPROM. Different programs can be flexibly defined to use the optimized sizes of NAND configured flash memory to achieve the highest number of application programs and data.

While this invention has been particularly shown and described with reference to the preferred embodiments thereof, it will be understood by those skilled in the art that various changes in form and details may be made without departing from the spirit and scope of the invention. The SRAM array as incorporated in combination volatile and nonvolatile memory integrated circuit of this, as described above, may be replaced with an pseudo SRAM or a dynamic random access memory (DRAM) array configured to be addressed as required for a smart card application.

The invention claimed is:

1. A combination volatile and nonvolatile memory integrated circuit placed on a substrate comprising
    at least one volatile memory array placed on said substrate;
    a plurality of nonvolatile memory arrays placed on said substrate and having an address associated with said volatile memory array, wherein any of the plurality of the nonvolatile memory arrays is three transistor NAND configured electrically erasable programmable read only memories for retention of shorter term data that has a high number of program and erase cycles; and
    a memory control circuit in communication with external circuitry to receive address, command, and data signals, to interpret said address, command, and data signals, and in communication with said volatile memory array and said plurality of nonvolatile memory arrays to transfer said address, command and data signals for reading, writing, programming, and erasing said volatile and nonvolatile memory arrays.

2. The combination volatile and nonvolatile memory integrated circuit of claim 1 further comprising:
    a voltage generator that generates a very large positive programming voltage and a very large negative erasing voltage and is in communication with said nonvolatile memory arrays to transfer said very large positive programming voltage to selected first sub-arrays of said nonvolatile memory arrays for programming said selected first sub-arrays and to transfer said very large negative erasing voltage to selected second sub-arrays of said nonvolatile memory arrays for erasing said selected second sub-arrays.

3. The combination volatile and nonvolatile memory integrated circuit of claim 1 wherein said volatile memory array is selected from a set of volatile random access memories consisting of a static random access memory, a pseudo static random access memory, and a dynamic random access memory.

4. The combination volatile and nonvolatile memory integrated circuit of claim 1 wherein any of the plurality of the nonvolatile memory arrays is masked programmed read only memory arrays for retention of permanent unchangeable data.

5. The combination volatile and nonvolatile memory integrated circuit of claim 1 wherein any of the plurality of the nonvolatile memory arrays is the three transistor NAND configured electrically erasable programmable read only memories or optionally NAND configured flash memory for retention of long term data that has a low number of program and erase cycles.

6. The combination volatile and nonvolatile memory integrated circuit of claim 5 wherein the long term data is selected from the set of data types consisting of application program data, biometric identification information data, and other digital data not requiring a high rate of modification.

7. The combination volatile and nonvolatile memory integrated circuit of claim 1 wherein the shorter term data is selected from the data types consisting of short electronic mail digital data, electronic phone book digital data, and other application and program digital data requiring a high rate of modification.

8. The combination volatile and nonvolatile memory integrated circuit of claim 2 wherein the voltage generator further generates a power supply voltage, a first moderately high positive program voltage, a second moderately high positive program voltage, an intermediate positive program voltage, and a ground reference voltage.

9. The combination volatile and nonvolatile memory integrated circuit of claim 5 wherein one of said nonvolatile memory arrays is optionally the NAND configured flash memory and programming the selected first sub-arrays by setting at least one bit line of said selected first sub-arrays to the second moderately high positive program voltage, at least one word line of said selected first sub-arrays to the very large positive programming voltage, at least one source line of said selected first sub-arrays to the second moderately high positive program voltage, and a bulk region of all cells of said selected first sub-array to the ground reference voltage.

10. The combination volatile and nonvolatile memory integrated circuit of claim 1 wherein one of said nonvolatile memory arrays is the three transistor NAND configured electrically erasable programmable read only memories and programming the selected first sub-arrays by setting at least one bit line of said selected first sub-arrays to the ground reference, at least one first select gate line of said selected sub-arrays to the power supply voltage, at least one second select gate line of said selected sub-arrays to the ground reference voltage, at least one word line of said selected first sub-arrays to the very large positive programming voltage, at least one source line of said selected first sub-arrays to the ground reference voltage, and a bulk region of all cells of said selected first sub-array to the ground reference voltage.

11. The combination volatile and nonvolatile memory integrated circuit of claim 10 wherein those cells of said selected first sub-arrays not programmed but have the word line at the very large positive programming voltage are inhibited from programming by setting bit lines of non-selected cells of said selected sub-arrays to the power supply voltage.

12. The combination volatile and nonvolatile memory integrated circuit of claim 10 wherein said very large positive programming voltage is generated externally to said combination volatile and nonvolatile memory integrated circuit.

13. The combination volatile and nonvolatile memory integrated circuit of claim 10 wherein said large positive programming voltage is from approximately +15.0 to approximately +22.0V.

14. The combination volatile and nonvolatile memory integrated circuit of claim 5 wherein one of said nonvolatile memory arrays is the NAND configured flash memory and erasing the selected second sub-arrays by setting at least one word line of said selected second sub-arrays to the very large negative erasing voltage, very large negative erasing voltage, at least one source line of said selected second sub-arrays, and a bulk region of all cells of said selected second sub-array to the ground reference voltage.

15. The combination volatile and nonvolatile memory integrated circuit of claim 1 wherein one of said nonvolatile memory arrays is the three transistor NAND configured electrically erasable programmable read only memories and erasing the selected second sub-arrays by setting at least one first select gate line and second select gate line of said selected sub-arrays to the power supply voltage, at least one word line of said selected second sub-arrays to the very large negative erasing voltage, at least one bit line of said selected second sub-arrays, at least one source line of said selected second sub-arrays, and a bulk region of all cells of said selected second sub-array to the ground reference voltage.

16. The combination volatile and nonvolatile memory integrated circuit of claim 10 wherein said very large negative erasing voltage is generated externally to said combination volatile and nonvolatile memory integrated circuit.

17. The combination volatile and nonvolatile memory integrated circuit of claim 10 wherein said large negative erasing voltage is from approximately −15.0 to approximately −22.0V.

18. The combination volatile and nonvolatile memory integrated circuit of claim 1 wherein data resident within any of said plurality of nonvolatile memories may be transferred to said volatile memory such that said volatile memory acts to retain data selected from the classes of data consisting of operational data, temporary data, and scratch pad data.

19. A smart card for securely providing, receiving, and processing secure digital data, said smart card comprising:
  a combination volatile and nonvolatile memory integrated circuit placed on a substrate comprising
    at least one volatile memory array placed on said substrate;
    a plurality of nonvolatile memory arrays placed on said substrate and having an address associated with said volatile memory array, wherein any of the plurality of the nonvolatile memory arrays is three transistor NAND configured electrically erasable programmable read only memories for retention of shorter term data that has a high number of program and erase cycles;
    a memory control circuit in communication with external circuitry to receive address, command, and data signals, to interpret said address, command, and data signals, and in communication with said volatile memory array and said plurality of nonvolatile memory arrays to transfer said address, command and data signals for reading, writing, programming, and erasing said volatile and nonvolatile memory arrays.

20. The smart card of claim 19 wherein said combination volatile and nonvolatile memory integrated circuit further comprises:
  a voltage generator that generates a very large positive programming voltage and a very large negative erasing voltage and is in communication with said nonvolatile memory arrays to transfer said very large positive programming voltage to selected first sub-arrays of said nonvolatile memory arrays for programming said selected first sub-arrays and to transfer said very large negative erasing voltage to selected second sub-arrays of said nonvolatile memory arrays for erasing said selected second sub-arrays.

21. The smart card of claim 19 wherein said volatile memory array is selected from a set of volatile random access memories consisting of a static random access memory, a pseudo static random access memory, and a dynamic random access memory.

22. The smart card of claim 19 wherein any of the plurality of the nonvolatile memory arrays is masked programmed read only memory arrays for retention of permanent unchangeable data.

23. The smart card of claim 19 wherein any of the plurality of the nonvolatile memory arrays is NAND configured flash memory for retention of long term data that has a low number of program and erase cycles.

24. The smart card of claim 23 wherein the long term data is selected from the set of data types consisting of application program data, biometric identification information data, and other digital data not requiring a high rate of modification.

25. The smart card of claim 19 wherein the shorter term data is selected from the data types consisting of short electronic mail digital data, electronic phone book digital data, and other digital data requiring a high rate of modification.

26. The smart card of claim 20 wherein the voltage generator further generates a power supply voltage, a first moderately high positive program voltage, a second moderately high positive program voltage, an intermediate positive program voltage, and a ground reference voltage.

27. The smart card of claim 23 wherein one of said nonvolatile memory arrays is the NAND configured flash memory and programming the selected first sub-arrays by setting at least one bit line of said selected first sub-arrays to the second moderately high positive program voltage, at least one word line of said selected first sub-arrays to the very large positive programming voltage, at least one source line of said selected first sub-arrays to the second moderately high positive program voltage, and a bulk region of all cells of said selected first sub-array to the ground reference voltage.

28. The smart card of claim 19 wherein one of said nonvolatile memory arrays is the three transistor NAND configured electrically erasable programmable read only memories and programming the selected first sub-arrays by setting at least one bit line of said selected first sub-arrays to the ground reference, at least one first select gate line of said selected sub-arrays to the power supply voltage, at least one word line of said selected first sub-arrays to the very large positive programming voltage, at least one source line of said selected first sub-arrays to the ground reference voltage, and a bulk region of all cells of said selected first sub-array to the ground reference voltage.

29. The smart card of claim 26 wherein said combination volatile and nonvolatile memory integrated circuit is in communication with an external voltage generator that generates a very large positive programming voltage for transfer to selected first sub-arrays of said nonvolatile memory arrays for programming said selected first sub-arrays and generates a very large negative erasing voltage for transfer to selected second sub-arrays of said nonvolatile memory arrays for erasing said selected second sub-arrays.

30. The smart card of claim 19 wherein said very large positive programming voltage is from approximately +15.0 to approximately +22.0V.

31. The smart card of claim 28 wherein those cells of said selected first sub-arrays not programmed but have the word line at the very large positive programming voltage are inhibited from programming by setting bit lines of non-selected cells of said selected sub-arrays to the power supply voltage.

32. The smart card of claim 19 wherein one of said nonvolatile memory arrays is the NAND configured flash memory and erasing the selected second sub-arrays by setting at least one word line of said selected second sub-arrays to the very large negative erasing voltage, and by setting at least one source line of said selected second sub-arrays, and a bulk region of all cells of said selected second sub-array to the ground reference voltage.

33. The smart card of claim 19 wherein one of said nonvolatile memory arrays is the three transistor NAND configured electrically erasable programmable read only memories and erasing the selected second sub-arrays by setting at least one first select gate line and second select gate line of said selected sub-arrays to the power supply voltage, at least one word line of said selected second sub-arrays to the very large negative erasing voltage, at least one bit line of said selected second sub-arrays, at least one source line of said selected second sub-arrays, and a bulk region of all cells of said selected second sub-array to the ground reference voltage.

34. The smart card of claim 32 wherein said very large negative erasing voltage is generated externally to said combination volatile and nonvolatile memory integrated circuit.

35. The smart card of claim 32 wherein said very large negative erasing voltage is from approximately −15.0 to approximately −22.0V.

36. The smart card of claim 19 wherein data resident within any of said plurality of nonvolatile memories may be transferred to said volatile memory such that said volatile memory acts to retain data selected from the classes of data consisting of operational data, temporary data, and scratch pad data.

37. A nonvolatile memory cell formed on a substrate comprising:
a charge retention SONOS layer placed over a channel region of said memory cell and between a source region and a drain region of said memory cell;
wherein said memory cell is in communication with an erasing apparatus to remove electrical charge from said charge retention SONOS layer, said erasing apparatus comprising:
means for applying a very large negative voltage to said single poly control gate such that said erasing apparatus changes an applied voltage to said single poly control gate and a voltage applied to said source region, said drain region, and a bulk region of said memory cell is not changed, wherein said voltage applied to said bulk region is a ground reference voltage.

38. The nonvolatile memory cell of claim 37 wherein the very large negative voltage is approximately +20V.

39. The nonvolatile memory cell of claim 37 wherein said for erasing apparatus said memory cell further comprises:
means for applying a ground reference voltage to said source region and said drain region.

40. The nonvolatile memory cell of claim 37 wherein erasing apparatus has a duration of from approximately 1 ms to approximately 1 s.

41. The nonvolatile memory cell of claim 37 further comprising:
a gating transistor having a source connected to said drain region, a drain, and a gate connected to a select gate signal to selectively apply a bit line voltage signal to the drain region.

42. The nonvolatile memory cell of claim 40 wherein said erasing apparatus further comprises:
means for applying a ground reference voltage to said select gate.

43. The nonvolatile memory cell of claim 42 wherein erasing apparatus said memory cell further comprises:
means for applying a ground reference voltage to said source region and said drain region.

44. The nonvolatile memory cell of claim 37 wherein erasing apparatus has a duration of from approximately 1 ms to approximately 1 s.

45. A nonvolatile memory array formed on a substrate comprising:
a plurality of nonvolatile memory cells arranged in rows and columns, each nonvolatile memory cell comprising:
a charge retention SONGS layer placed on said surface in a channel region between a source region and a drain region of each nonvolatile memory cell, and
a single poly control gate placed over said charge retention SONOS layer, and
a plurality of bit lines, each bit line in communication with said drain region of all nonvolatile memory cells of one column of nonvolatile memory cells;
a plurality of source lines, each source line connected to said source region of all nonvolatile memory cells on one row of nonvolatile memory cells;
a plurality of word lines, each word line connected to the single poly control gate of all nonvolatile memory cells one row of the nonvolatile memory cells; and
wherein a selected memory cell is in communication with an erasing apparatus to remove electrical charge from said charge retention SONOS layer, said erasing apparatus comprising:
means for applying a very large negative voltage to the word line connected to said single poly control gate of the selected memory cell such that said erasing apparatus changes an applied voltage to said single poly control gate and a voltage applied to said source region, said drain region, and a bulk region of said memory cell is not changed.

46. The nonvolatile memory array of claim 45 wherein said voltage applied to said bulk region is a ground reference voltage.

47. The nonvolatile memory array of claim 45 wherein the very large negative voltage is from approximately +20V.

48. The nonvolatile memory array of claim 45 wherein erasing apparatus said memory cell further comprises:
means for applying a ground reference voltage to the source line connected to the source region of the selected memory cell and bit line in communication with the drain region of the selected nonvolatile memory cell.

49. The nonvolatile memory array of claim 45 wherein said erasing apparatus has a duration of from approximately 1 ms to approximately 1 s.

50. The nonvolatile memory array of claim 45 wherein each nonvolatile memory cell further comprises:
a gating transistor having a source connected to said drain region, a drain, and a gate connected to a select gate signal to selectively apply a bit line voltage signal to the drain region; and
a plurality of select lines, each select line connected to the gate of the gating transistor of each nonvolatile memory cell of one row of nonvolatile memory cells.

51. The nonvolatile memory array of claim 50 wherein said erasing apparatus further comprises:
means for applying a ground reference voltage to said select line connected to the gate of the gating transistor of the selected nonvolatile memory cell.

52. A nonvolatile memory cell formed on a substrate comprising:
a charge retention SONOS layer placed over a channel region of said memory cell and between a source region and a drain region of said memory cell; and
wherein said nonvolatile memory cell is in communication with a programming apparatus that places a charge upon said charge retention SONOS layer, said programming apparatus comprising:
means for applying a very large positive voltage to said single poly control gate,
means for applying an intermediate positive voltage to said drain region, and
means for applying a ground reference voltage to said source region and a bulk region, such that said programming apparatus changes an applied voltage to said single poly control gate and said ground reference voltage applied to a bulk region of said memory cell is not changed.

53. The nonvolatile memory cell of claim 52 wherein said intermediate positive voltage is approximately 5.0V.

54. The nonvolatile memory cell of claim 52 wherein means for applying said very large positive voltage, means for applying said intermediate positive voltage, and means for applying said ground reference voltage applies said very large positive voltage, said intermediate positive voltage, and said ground reference voltage for a duration of from approximately 1 µs to approximately 100 µs.

55. The nonvolatile memory cell of claim 52 wherein each nonvolatile memory cell further comprises:
a gating transistor having a source connected to the drain region, a drain connected to the bit line, and a gate connected to a select gate signal to selectively apply a bit line voltage signal to the drain region.

56. The nonvolatile memory cell of claim 55 wherein said programming apparatus further comprises:
means for applying an activation voltage to said gate of said gating transistor for activating said gating transistor.

57. A nonvolatile memory array formed on a substrate comprising:
a plurality of nonvolatile memory cells arranged in rows and columns, each nonvolatile memory cell comprising:
a charge retention SONOS layer placed on said surface in a channel region between a source region and a drain region of each nonvolatile memory cell, and
a single poly control gate placed over said charge retention SONOS layer and isolated from said charge retention SONOS layer by an insulating layer;
a plurality of bit lines, each bit line in communication with the drain region of all nonvolatile memory cells of one column of nonvolatile memory cells;
a plurality of source lines, each source line connected to the source region of all nonvolatile memory cells on one row of nonvolatile memory cells;
a plurality of word lines, each word line connected to the single poly control gate of all nonvolatile memory cells one row of the nonvolatile memory cells; and
wherein said plurality of nonvolatile memory cells is in communication with a programming apparatus that places a charge upon said charge retention SONOS layer, said programming apparatus comprising:
means for applying a very large positive voltage to the word line connected to the single poly control gate of said selected nonvolatile memory cells,
means for applying an intermediate positive voltage to the bit line in communication with the drain region of said selected nonvolatile memory cell such that the intermediate positive voltage is transferred to said drain region, and means for applying a ground reference voltage the source line connected to the source and a bulk region of the selected nonvolatile memory cell, such that said programming apparatus changes an applied voltage to said single poly control gate and said ground reference voltage applied to a bulk region of said memory cell is not changed.

58. The nonvolatile memory array of claim 57 wherein said intermediate positive voltage is approximately 6.0V such that approximately 5.0V is applied to the drain region.

59. The nonvolatile memory array of claim 58 wherein said means for applying said very large positive voltage, said means for applying said intermediate positive voltage, and said means for applying said ground reference voltage applies said very large positive voltage, said moderately high positive voltage, said intermediate positive voltage, and said ground reference voltage for a duration of from approximately 1 μs to approximately 100 μs.

60. A method for operating a nonvolatile memory array comprising the steps of:
   forming said nonvolatile memory array on a substrate, said forming comprising the steps of:
      arranging a plurality of nonvolatile memory cells in rows and columns, each nonvolatile memory cell comprising:
         a charge retention SONOS layer placed on said surface in a channel region between a source region and a drain region, and
         a single poly control gate placed over said charge retention SONOS layer;
      a plurality of bit lines, each bit line in communication with the drain region of all nonvolatile memory cells of one column of nonvolatile memory cells;
      a plurality of source lines, each source line connected to the source region of all nonvolatile memory cells on one row of nonvolatile memory cells; and
      a plurality of word lines, each word line connected to the single poly control gate of all nonvolatile memory cells one row of the nonvolatile memory cells;
   programming a selected nonvolatile memory cell to place a charge upon the charge retention SONOS layer of said selected nonvolatile memory cell by the steps of:
      applying a very large positive voltage to the word line connected to the single poly control gate of said selected nonvolatile memory cells;
      applying an intermediate positive voltage to the bit line in communication with the drain region of said selected nonvolatile memory cell such that the intermediate positive voltage is transferred to said drain region; and
      applying a ground reference voltage the source line connected to the source region and a bulk region of the selected nonvolatile memory cell, such that said programming apparatus changes an applied voltage to said single poly control gate and said ground reference voltage applied to a bulk region of said memory cell is not changed.

61. The method of claim 60 wherein said very large positive voltage is approximately +20 V.

62. The method of claim 60 wherein said intermediate positive voltage is approximately 6.0V such that approximately 5.0V is applied to the drain region.

63. The method of claim 60 wherein applying said very large positive voltage, said intermediate positive voltage, and applying said ground reference voltage has a duration of from approximately 1 μs to approximately 100 μs.

64. The method of claim 60:
   where in the nonvolatile memory cells further comprises a gating transistor having a source connected to the drain region, a drain connected to the bit line, and a gate connected to a select gate signal to selectively apply a bit line voltage signal to the drain region; and
   said nonvolatile memory array further comprises a plurality of select lines, each select line connected to the gate of the gating transistor of each nonvolatile memory cell of one row of nonvolatile memory cells; and
   programming said selected nonvolatile memory cell further comprises the steps of:
      applying an activation voltage to the select line connected to the gate of the gating transistor of the selected nonvolatile memory cell to activate said gating transistor.

65. The method of claim 64 wherein applying said very large positive voltage, said intermediate positive voltage, and applying said ground reference voltage has a duration of from approximately 1 μs to approximately 100 μs.

66. A method for operating a nonvolatile memory array comprising the steps of:
   forming said nonvolatile memory array on a substrate, said forming comprising the steps of:
      arranging a plurality of nonvolatile memory cells in rows and columns, each nonvolatile memory cell comprising:
         a charge retention SONOS layer placed on said surface in a channel region between a source region and a drain region, and
         a single poly control gate placed over said charge retention SONOS layer;
      a plurality of bit lines, each bit line in communication with the drain region of all nonvolatile memory cells of one column of nonvolatile memory cells;
      a plurality of source lines, each source line connected to the source region of all nonvolatile memory cells on one row of nonvolatile memory cells; and
      a plurality of word lines, each word line connected to the single poly control gate of all nonvolatile memory cells one row of the nonvolatile memory cells;
   erasing a selected memory cell to remove electrical charge from said charge retention SONOS layer by the step of:
      applying a very large negative voltage to the word line connected to said single poly control gate of the selected memory cell, such that said erasing changes an applied voltage to said to said single poly control gate and a voltage applied to said a bulk region of said memory cell is not changed.

67. The method of claim 66 wherein the very large negative voltage is from approximately −20V.

68. The method of claim 66 wherein erasing said memory cell further comprises the step of:
   applying a ground reference voltage to the source line connected to the source region of the selected memory cell and bit line in communication with the drain region of the selected nonvolatile memory cell.

69. The method of claim 66 wherein erasing said memory cell has a duration of from approximately 1 ms to approximately 1 s.

70. The method of claim 66
   where in the nonvolatile memory cells further comprises a gating transistor having a source connected to the drain region, a drain connected to the bit line, and a gate connected to a select gate signal to selectively apply a bit line voltage signal to the drain region; and said nonvolatile memory array further comprises a plurality of select lines, each select line connected to the gate of the gating transistor of each nonvolatile memory cell of one row of nonvolatile memory cells; and erasing said selected nonvolatile memory cell further comprises the steps of:

applying a ground reference voltage to said select line connected to the gate of the gating transistor of the selected nonvolatile memory cell.

71. The method of claim 70 wherein erasing said memory cell has a duration of from approximately 1 ms to approximately 1 s.

* * * * *